(12) United States Patent
Lu

(10) Patent No.: US 11,699,682 B2
(45) Date of Patent: Jul. 11, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 301 days.

(21) Appl. No.: 16/994,498

(22) Filed: Aug. 14, 2020

(65) Prior Publication Data
US 2022/0052024 A1 Feb. 17, 2022

(51) Int. Cl.
*H01L 25/065* (2023.01)
*H01L 23/538* (2006.01)
*H01L 21/50* (2006.01)
*H01L 21/768* (2006.01)

(52) U.S. Cl.
CPC .......... *H01L 25/0657* (2013.01); *H01L 21/50* (2013.01); *H01L 21/76802* (2013.01); *H01L 21/76877* (2013.01); *H01L 23/5384* (2013.01); *H01L 23/5386* (2013.01)

(58) Field of Classification Search
CPC .................................................. H01L 25/0657
See application file for complete search history.

(56) References Cited

U.S. PATENT DOCUMENTS

2009/0039523 A1* 2/2009 Jiang ................... H01L 24/19
257/777

FOREIGN PATENT DOCUMENTS

JP 4114629 B2 7/2008

* cited by examiner

*Primary Examiner* — William A Harriston
(74) *Attorney, Agent, or Firm* — Foley & Lardner LLP

(57) ABSTRACT

A semiconductor device package and a method of manufacturing the same are provided. The semiconductor device package includes a first module, a second module, a first intermediate circuit layer, a first conductive transmission path and a second conductive transmission path. The second module is stacked on the first module. The first intermediate circuit layer is arranged between the first module and the second module. The first conductive transmission is configured to electrically connect the first semiconductor module with the first intermediate circuit layer. The second conductive transmission path is configured to electrically connect the first intermediate circuit layer with the second semiconductor module.

17 Claims, 27 Drawing Sheets

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same, and a semiconductor device package having multiple double side modules which are stacked with each other.

2. Description of Related Art

A semiconductor device includes a plurality of modules. Each module includes a circuit layer and multiple electronic components with different functions mounted to the circuit layer. These modules are stacked with each other and electrically connected to each other. The yield rate of the stacked modules is a significant issue for the semiconductor device.

SUMMARY

According to one example embodiment of the instant disclosure, a semiconductor device package includes a first module, a second module and a first intermediate circuit layer. The second module is stacked on the first module. The first intermediate circuit layer is arranged between the first module and the second module. No electronic component is mounted on the first intermediate circuit layer.

According to another example embodiment of the instant disclosure, a semiconductor device package includes a first semiconductor module, a first intermediate circuit layer and a second module. The first intermediate circuit layer is disposed on the first module. The second module is disposed on the first intermediate circuit layer. The first and second semiconductor modules are electrically connected to each other. Both surfaces of the first intermediate circuit layer are free from an electronic component.

According to another example embodiment of the instant disclosure, method of manufacturing a semiconductor device package includes: providing a first semiconductor module; disposing a first intermediate circuit layer on the first semiconductor module; disposing a second semiconductor module on the first intermediate circuit layer; and forming a conductive via, which is configured to electrically connect the second semiconductor module with the first intermediate circuit layer or electrically connect the second semiconductor module with the first semiconductor module.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1:
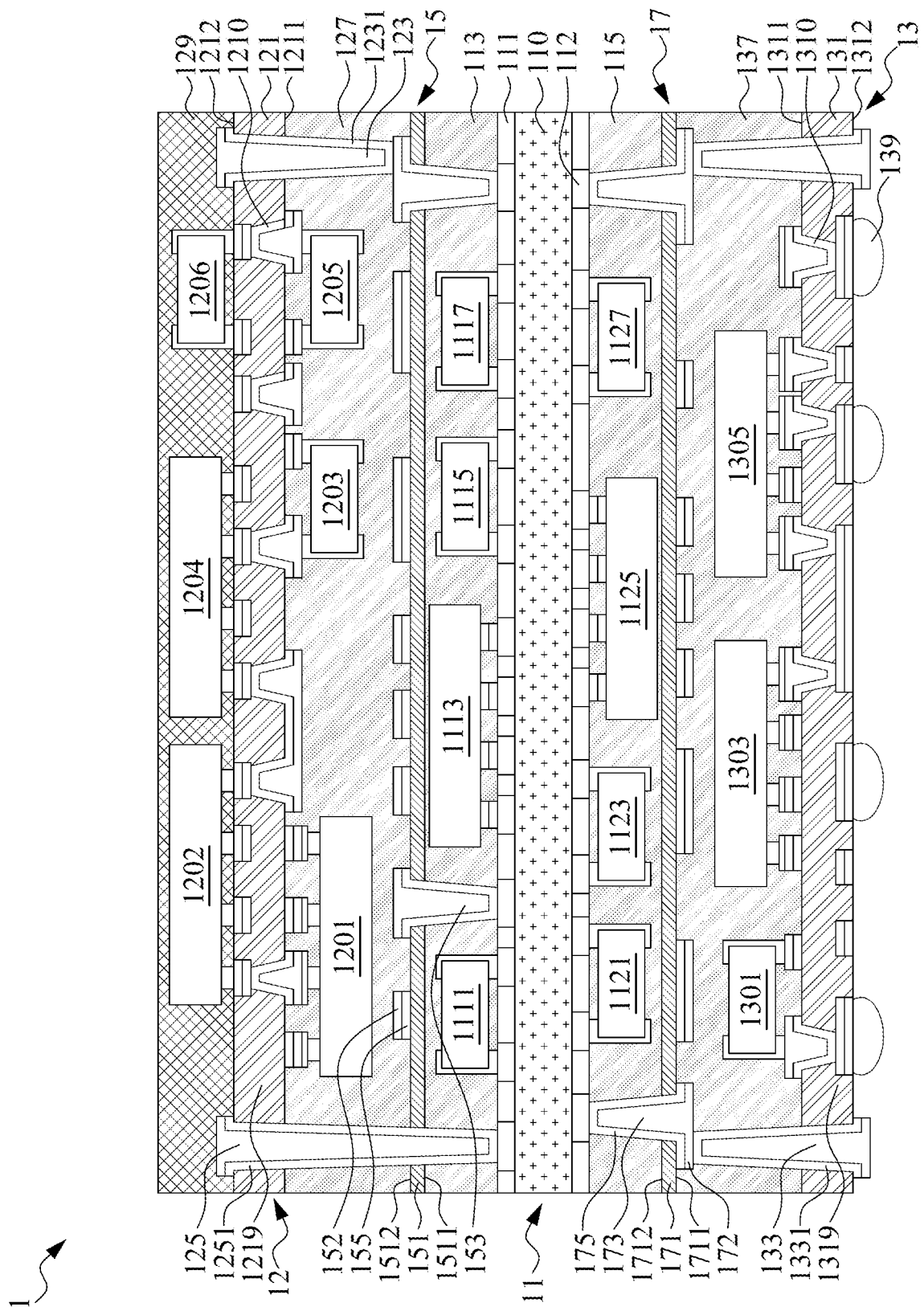
FIG. 1 is a cross-sectional view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with a multilayer structure includes at least two staking modules. The modules are electrically connected to each other by a conductive via. This configuration prevents the semiconductor device package from being short-circuited in the heating process, and thus the electrical connection between the modules is improved.

FIG. 1 is a cross-sectional view of a semiconductor device package 1 in accordance with some embodiments of the present disclosure. As shown in FIG. 1, the semiconductor device 1 includes three double side modules (DSM) 11, 12 and 13. The double side module 11 may include a conductive substrate 110, electronic components 1111, 1113, 1115, 1117, 1121, 1123, 1125, 1127, adhesion layers 113, 115. The conductive substrate 110 may include circuit layers 111 and 112 at least partially embedded therein. In some embodiments of the present disclosure, the circuit layer 111 is partially embedded in the upper surface of the conductive substrate 110, and thus the circuit layer 111 is arranged to be adjacent to the upper surface of the conductive substrate 110.

The circuit layer 111 may include a substrate-level circuit layer. The line width/spacing (L/S) of the circuit layer 111 may be, but is not limited to be, larger than about 10 μm/about 10 μm. In some embodiments of the present disclosure, the circuit layer 112 is partially embedded in the lower surface of the conductive substrate 110, and thus the circuit layer 112 is arranged to be adjacent to the lower surface of the conductive substrate 110. The circuit layer 112 may include a substrate-level circuit layer. The line width/spacing (L/S) of the circuit layer 112 may be, but is not limited to be, larger than about 10 μm/about 10 μm.

Referring to FIG. 1, the electronic components 1111, 1113, 1115 and 1117 are disposed or mounted on the circuit layer 111 of the conductive substrate 11 and electrically connect to the circuit layer 111 of the conductive substrate 11. The electronic components 1111, 1113, 1115 and 1117 may be a die, an active device, a passive device, and/or other electronic devices. The adhesion layer 113 may cover or encapsulate the circuit layer 111 of the substrate 11 and the electronic components 1111, 1113, 1115 and 1117. In some embodiments of the present disclosure, the adhesion layer 113 may include a liquid adhesion. In some embodiments of the present disclosure, the adhesion layer 113 may include an adhesive tape. In some embodiments of the present disclosure, the adhesion layer 113 may include an adhesive film. Further, referring to FIG. 1, the electronic components 1121, 1123, 1125 and 1127 are disposed or mounted on the circuit layer 112 of the conductive substrate 12 and electrically connect to the circuit layer 112 of the conductive substrate 11. The electronic components 1121, 1123, 1125 and 1127 may be a die, an active device, a passive device, and/or other electronic devices. The adhesion layer 115 may cover or encapsulate the circuit layer 112 of the substrate 11 and the electronic components 1121, 1123, 1125 and 1127. In some embodiments of the present disclosure, the adhesion layer 115 may include a liquid adhesion. In some embodiments of the present disclosure, the adhesion layer 115 may include an adhesive tape. In some embodiments of the present disclosure, the adhesion layer 115 may include an adhesive film.

As shown in FIG. 1, the double side module 12 is stacked and disposed on the double side module 11. The double side module 12 may include a circuit layer 121, electronic components 1201, 1202, 1203, 1204, 1205, 1206, an adhesion layer 127 and an encapsulant 129. The circuit layer 121 may include a dielectric layer 1219 and an interconnection layer 1210 at least partially embedded in the dielectric layer 1219. The line width/spacing (L/S) of the circuit layer 121 may be, but is not limited to be, between about 2 μm/about 2 μm. Thus, the line width/spacing (L/S) of the circuit layer 121 is narrower than the L/S of the circuit layer 111 or circuit layer 112 of the conductive substrate 11.

Referring to FIG. 1, the circuit layer 121 includes a surface 1211 (e.g., a lower surface) facing the double side module 11. The electronic components 1201, 1203, 1205 are disposed or mounted on the surface 1211 of the circuit layer 121 and electrically connect to the interconnection layer 1210 of the circuit layer 121. The electronic components 1201, 1203 and 1205 may be a die, an active device, a passive device, and/or other electronic devices. The adhesion layer 127 may cover or encapsulate the surface 1211 of the circuit layer 121 and the electronic components 1201, 1203, 1205. In some embodiments of the present disclosure, the adhesion layer 127 may include a liquid adhesion. In some embodiments of the present disclosure, the adhesion layer 127 may include an adhesive tape. In some embodiments of the present disclosure, the adhesion layer 127 may include an adhesive film. Further, referring to FIG. 1, the circuit layer 121 includes a surface 1212 (e.g., an upper surface) facing away from the double side module 11. The electronic components 1202, 1204, 1206 are disposed or mounted on the surface 1212 of the circuit layer 121 and electrically connect to the interconnection layer 1210 of the circuit layer 121. The electronic components 1202, 1204 and 1206 may be a die, an active device, a passive device, and/or other electronic devices. The encapsulant 129 may encapsulate the surface 1212 of the circuit layer 121 and the electronic components 1202, 1204, 1206. In some embodiments of the present disclosure, the encapsulant 129 may include molding compounds such epoxy resin, and fillers such as silicon oxide fillers may be filled in the molding compound. In some embodiments of the present disclosure, the encapsulant 129 may include a molding underfill (MUF) or a capillary underfill (CUF).

As shown in FIG. 1, an intermediate circuit layer 15 is arranged between the double side module 11 and the double side module 12. Thus, the intermediate circuit layer 15 is disposed on the double side module 11, and the double side module 12 is disposed on the intermediate circuit layer 15. In some embodiments of the present disclosure, the intermediate circuit layer 15 includes a dielectric layer 151 and an interconnection layer 152. The dielectric layer 151 may include an organic material, such as a polyamide (PA). The dielectric layer 151 has a surface 1511 (e.g., a lower surface) facing the double side module 11 and a surface 1512 (e.g., an upper surface) facing the double side module 12. The interconnection layer 152 is disposed on the surface 1512 of the dielectric layer 151. In some embodiments of the present disclosure, the intermediate circuit layer 15 further include a through via 153 extending to the conductive substrate 110. The through via 153 may extend from the surface 1512 of the dielectric layer 151 to the circuit layer 111 of the conductive substrate 11. The through via 153 may connect the interconnection layer 152 of the intermediate circuit layer 15 and the circuit layer 111 of the conductive substrate 11. Thus, the through via 153 is configured to electrically connect the intermediate circuit layer 15 to the double side module 11. In addition, the intermediate circuit 15 may further include a seed layer 155. The seed layer 155 may be arranged between the dielectric layer 151 and the interconnection layer 152 and/or arranged on the sidewall of the through via 153.

As shown in FIG. 1, the surface 1511 of the dielectric layer 151 and through via 153 are encapsulated or covered by the adhesion layer 113, and the surface 1512 of the dielectric layer 151 and the interconnection layer 152 are encapsulated or covered by the adhesion layer 127. There is no electronic component mounted on the intermediate circuit layer 15. That is, both surfaces of the intermediate circuit layer 15 are free from an electronic component.

Moreover, the double side module 12 may include a conductive via 123 extending from the circuit layer 121 to the intermediate circuit layer 15. Referring to FIG. 1, the conductive via 123 extends through the circuit layer 121 to the intermediate circuit layer 15. The conductive via 123 may connect the interconnection layer 1210 of the circuit layer 121 and the interconnection layer 152 and/or the through via 153 of the intermediate circuit layer 15. That is, the conductive via 123 is configured to electrically connect the double side module 12 to the intermediate circuit layer 15. Further, as stated above, the intermediate layer 15 electrically connects to the double side module 11 by the through via 153, and thus the double side module 12 electrically connects to the double side module 11 by the conductive via 123, the intermediate circuit layer 15 and the through via 153. In addition, the conductive via 123 may further include a seed layer 1231.

In some embodiments of the present disclosure, the double side module 12 includes a conductive via 125 extending from the circuit layer 121 to the circuit layer 111 of the substrate 11. Referring to FIG. 1, the conductive via 125 extends through the circuit layer 121 and the intermediate circuit layer 15. The conductive via 125 may connect the interconnection layer 1210 of the circuit layer 121 and the circuit layer 121. Thus, the conductive via 125 is configured to electrically connect the double side module 12 to the double side module 11. In other words, the double side module 12 electrically connects the double side module 11 by the conductive via 125. Moreover, the conductive via 125 may include a seed layer 1251.

As shown in FIG. 1, the double side module 13 is stacked and disposed on the double side module 11. The double side module 13 may include a circuit layer 131, electronic components 1301, 1303, 1305, an adhesion layer 137 and electrical connections 139. The circuit layer 131 may include a dielectric layer 1319 and an interconnection layer 1310 at least partially embedded in the dielectric layer 1319. The line width/spacing (L/S) of the circuit layer 131 may be, but is not limited to be, between about 2 μm/about 2 μm. Thus, the line width/spacing (L/S) of the circuit layer 131 is narrower than the L/S of the circuit layer 111 or circuit layer 112 of the conductive substrate 11.

Referring to FIG. 1, the circuit layer 131 includes a surface 1311 (e.g., an upper surface) facing the double side module 11. The electronic components 1301, 1303, 1305 are disposed or mounted on the surface 1311 of the circuit layer 131 and electrically connect to the interconnection layer 1310 of the circuit layer 131. The electronic components 1301, 1303 and 1305 may be a die, an active device, a passive device, and/or other electronic devices. The adhesion layer 137 may cover or encapsulate the surface 1311 of the circuit layer 131 and the electronic components 1301, 1303, 1305. In some embodiments of the present disclosure, the adhesion layer 137 may include a liquid adhesion. In some embodiments of the present disclosure, the adhesion layer 137 may include an adhesive tape. In some embodiments of the present disclosure, the adhesion layer 137 may include an adhesive film. Further, referring to FIG. 1, the circuit layer 131 includes a surface 1312 (e.g., a lower surface) facing away from the double side module 11. The electrical connections 139 are disposed or mounted on the surface 1312 of the circuit layer 131 and electrically connect the interconnection layer 1310 of the circuit layer 131. The electrical connection 139 may include a solder ball or a solder bump such as a C4 bump.

As shown in FIG. 1, an intermediate circuit layer 17 is arranged between the double side module 11 and the double side module 13. Thus, the intermediate circuit layer 17 is disposed on the double side module 11, and the double side module 13 is disposed on the intermediate circuit layer 17. In some embodiments of the intermediate circuit layer 17 includes a dielectric layer 171 and an interconnection layer 172. The dielectric layer 171 may include an organic material, such as a polyamide (PA). The dielectric layer 171 has a surface 1711 (e.g., an upper surface) facing the double side module 11 and a surface 1712 (e.g., a lower surface) facing the double side module 13. The interconnection layer 172 is disposed on the surface 1712 of the dielectric layer 171. In some embodiments of the present disclosure, the intermediate circuit layer 17 further include a through via 173 extending to the conductive substrate 110. The through via 173 may extend from the surface 1712 of the dielectric layer 171 to the circuit layer 112 of the conductive substrate 11. The through via 173 may connect the interconnection layer 172 of the intermediate circuit layer 17 and the circuit layer 112 of the conductive substrate 11. Thus, the through via 173 is configured to electrically connect the intermediate circuit layer 17 to the double side module 11. In addition, the intermediate circuit 17 may further include a seed layer 175. The seed layer 175 may be arranged between the dielectric layer 171 and the interconnection layer 172 and/or arranged on the sidewall of the through via 173.

As shown in FIG. 1, the surface 1711 of the dielectric layer 171 and through via 173 are encapsulated or covered by the adhesion layer 115, and the surface 1712 of the dielectric layer 171 and the interconnection layer 172 are encapsulated or covered by the adhesion layer 137. There is no electronic component mounted on the intermediate circuit layer 17. That is, both surfaces of the intermediate circuit layer 17 are free from an electronic component.

Moreover, the double side module 13 may include a conductive via 133 extending from the circuit layer 131 to the intermediate circuit layer 17. Referring to FIG. 1, the conductive via 133 extends through the circuit layer 131 to the intermediate circuit layer 17. The conductive via 133 may connect the interconnection layer 1310 of the circuit layer 131 and the interconnection layer 172 and/or the through via 173 of the intermediate circuit layer 17. That is, the conductive via 133 is configured to electrically connect the double side module 13 to the intermediate circuit layer 17. Further, as stated above, the intermediate layer 17 electrically connects to the double side module 11 by the through via 173, and thus the double side module 13 electrically connects to the double side module 11 by the conductive via 133, the intermediate circuit layer 17 and the through via 173. In addition, the conductive via 133 may further include a seed layer 1331.

Figure 2:
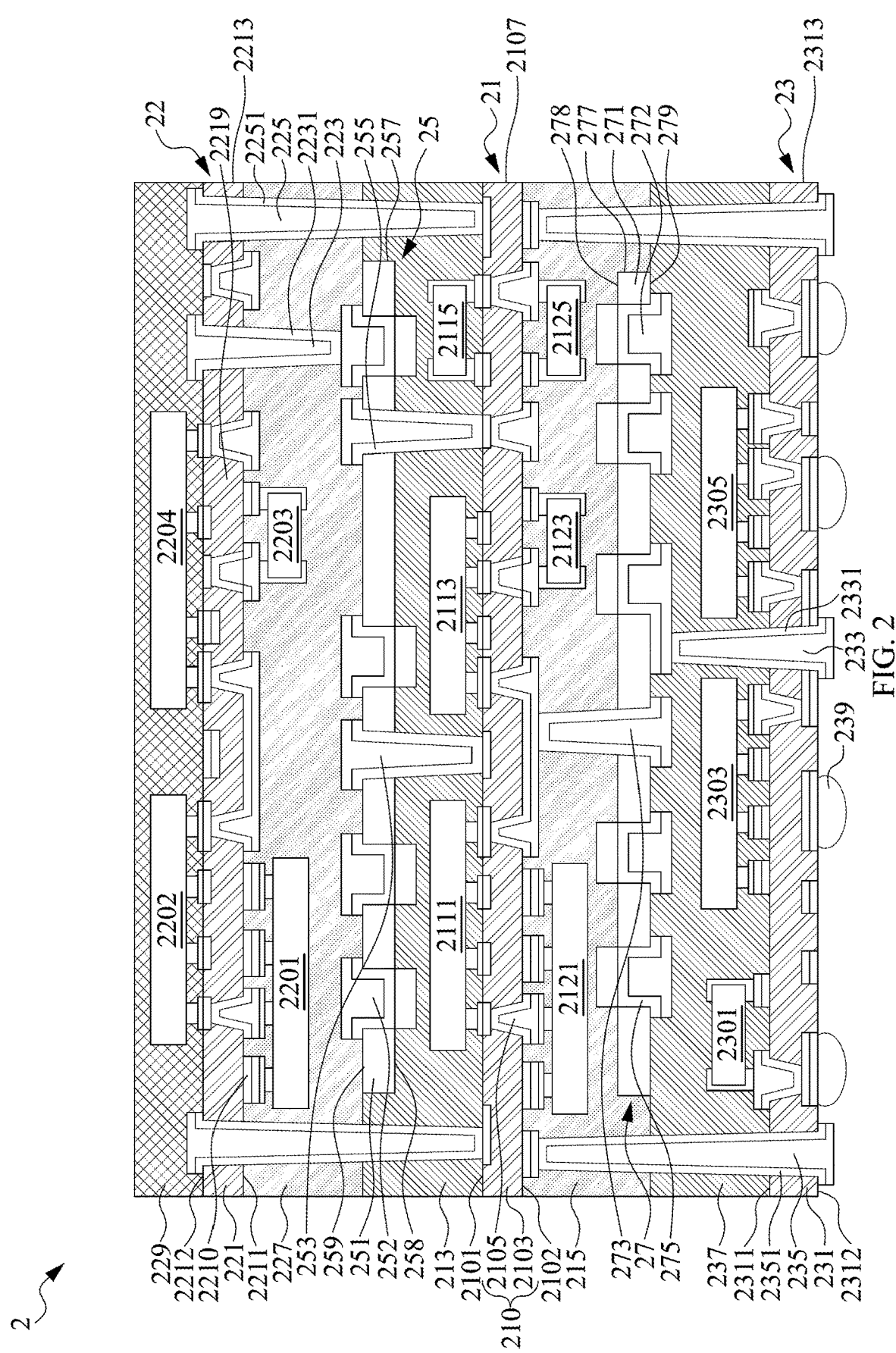
FIG. 2 is a cross-sectional view of a semiconductor device package in accordance with an embodiment of the instant disclosure.

FIG. 2 is a cross-sectional view of a semiconductor device package 2 in accordance with some embodiments of the present disclosure. As shown in FIG. 2, the semiconductor device 2 includes three double side modules (DSM) 21, 22 and 23. The double side module 21 may include a circuit layer 210, electronic components 2111, 2113, 2115, 2121, 2123, 2125 and adhesion layers 213, 215. The circuit layer 210 has a surface 2101 (e.g., an upper surface) and a surface 2102 (e.g., a lower surface) opposite to the surface 2101. In some embodiments of the present disclosure, the circuit layer 210 includes a dielectric layer 2103 and an interconnection layer 2105 at least partially embedded in the dielectric layer 2103. The electric components 2111, 2113, 2115 are disposed and mounted on the surface 2101 of the circuit layer 210 and electrically connect to the interconnection layer 2105 of the circuit layer 210. The electronic components 2111, 2113 and 2115 may be a die, an active device, a passive device, and/or other electronic devices. The adhesion layer 213 may cover or encapsulate the surface 2101 of the circuit layer 210 and the electronic components 2111, 2113, 2115. In some embodiments of the present disclosure, the adhesion layer 213 may include a liquid adhesion. In some embodiments of the present disclosure, the adhesion layer 213 may include an adhesive tape. In some embodiments of the present disclosure, the adhesion layer 213 may include an adhesive film.

Further, the electric components 2121, 2123, 2125 are disposed and mounted on the surface 2102 of the circuit layer 210 and electrically connect to the interconnection layer 2105 of the circuit layer 210. The electronic components 2121, 2123 and 2125 may be a die, an active device, a passive device, and/or other electronic devices. The adhesion layer 215 may cover or encapsulate the surface 2102 of the circuit layer 210 and the electronic components 2121, 2123, 2125. In some embodiments of the present disclosure, the adhesion layer 215 may include a liquid adhesion. In some embodiments of the present disclosure, the adhesion layer 215 may include an adhesive tape. In some embodiments of the present disclosure, the adhesion layer 215 may include an adhesive film.

As shown in FIG. 2, the double side module 22 is stacked and disposed on the double side module 21. The double side module 22 may include a circuit layer 221, electronic components 2201, 2203, 2202, 2204, an adhesion layer 227 and an encapsulant 229. The circuit layer 221 may include a dielectric layer 2219 and an interconnection layer 2210 at least partially embedded in the dielectric layer 2219.

Referring to FIG. 2, the circuit layer 221 includes a surface 2211 (e.g., a lower surface) facing the double side module 21. The electronic components 2201, 2203 are disposed or mounted on the surface 2211 of the circuit layer 221 and electrically connect to the interconnection layer 2210 of the circuit layer 221. The electronic components 2201, 2203 may be a die, an active device, a passive device, and/or other electronic devices. The adhesion layer 227 may cover or encapsulate the surface 2211 of the circuit layer 221 and the electronic components 2201, 2203. In some embodiments of the present disclosure, the adhesion layer 227 may include a liquid adhesion. In some embodiments of the present disclosure, the adhesion layer 227 may include an adhesive tape. In some embodiments of the present disclosure, the adhesion layer 227 may include an adhesive film. Further, referring to FIG. 2, the circuit layer 221 includes a surface 2212 (e.g., an upper surface) facing away from the double side module 21. The electronic components 2202, 2204 are disposed or mounted on the surface 2212 of the circuit layer 221 and electrically connect to the interconnection layer 2210 of the circuit layer 221. The electronic components 2202, 2204 may be a die, an active device, a passive device, and/or other electronic devices. The encapsulant 229 may encapsulate the surface 2212 of the circuit layer 221 and the electronic components 2202, 2204. In some embodiments of the present disclosure, the encapsulant 229 may include molding compounds such epoxy resin, and fillers such as silicon oxide fillers may be filled in the molding compound. In some embodiments of the present disclosure, the encapsulant 229 may include a molding underfill (MUF) or a capillary underfill (CUF).

As shown in FIG. 2, an intermediate circuit layer 25 is arranged between the double side module 21 and the double side module 22. Thus, the intermediate circuit layer 25 is disposed on the double side module 21, and the double side module 22 is disposed on the intermediate circuit layer 25. That is, the intermediate circuit layer 25 includes a surface 258 (e.g., a lower surface) facing the double side module 21 and a surface 259 (e.g., an upper surface) facing the double side module 22. In some embodiments of the present disclosure, the intermediate circuit layer 25 includes a dielectric layer 251 and an interconnection layer 252 at least partially embedded in the dielectric layer 251. The dielectric layer 251 may include an inorganic material, such as silicon. In some embodiments of the present disclosure, the intermediate circuit layer 25 further include a through via 253 extending to the circuit layer 210. The through via 253 may connect the interconnection layer 252 of the intermediate circuit layer 25 and the interconnection layer 2105 of the circuit layer 210. Thus, the through via 253 is configured to electrically connect the intermediate circuit layer 25 to the double side module 21. In addition, the intermediate circuit 25 may further include a seed layer 255. The seed layer 255 may be arranged between the dielectric layer 251 and the interconnection layer 252 and/or arranged on the sidewall of the through via 253.

As shown in FIG. 2, there is no electronic component mounted on the intermediate circuit layer 25. That is, both surfaces of the intermediate circuit layer 25 are free from an electronic component.

In some embodiments of the present disclosure, an area occupied by the intermediate circuit layer 25 is smaller than an area occupied by the circuit layer 210. That is, the intermediate circuit layer 25 is smaller than the circuit layer 210 from a top view perspective. In some embodiments of the present disclosure, a projection area of the intermediate circuit layer 25 on the surface 2101 of the circuit layer 210 is smaller than an area of the surface 2101 of the circuit layer 210. In some embodiments of the present disclosure, the projection area of the intermediate circuit layer 25 on the surface 2101 of the circuit layer 210 is included in the area of the surface 2101 of the circuit layer 210. A side surface 257 of the intermediate circuit layer 25 may not be coplanar with a side surface 2107 of the circuit layer 210. In some embodiments of the present disclosure, the area occupied by the intermediate circuit layer 25 is smaller than an area occupied by the circuit layer 221. That is, the intermediate circuit layer 25 is smaller than the circuit layer 221 from a top view perspective. In some embodiments of the present disclosure, a projection area of the intermediate circuit layer 25 on the surface 2101 of the circuit layer 210 is smaller than a projection area of the circuit layer 221 on the surface 2101 of the circuit layer 210. In some embodiments of the present disclosure, the projection area of the intermediate circuit layer 25 on the surface 2101 of the circuit layer 210 is included in the projection area of the circuit layer 221 on the surface 2101 of the circuit layer 210. The side surface 257 of the intermediate circuit layer 25 may not be coplanar with a side surface 2213 of the circuit layer 221. Referring to FIG. 2, the adhesion layer 213 may cover the side surfaces 257 and the surface 259 of the intermediate layer 25 and the adhesion layer 227 may cover the surface 258 of the intermediate layer 25. Moreover, the adhesion layer 213 may directly contact the adhesion layer 227.

Moreover, the double side module 22 may include a conductive via 223 extending from the circuit layer 221 to the intermediate circuit layer 25. Referring to FIG. 2, the conductive via 223 extends through the circuit layer 221 to the intermediate circuit layer 25. The conductive via 223 may connect the interconnection layer 2210 of the circuit layer 221 and the interconnection layer 252 and/or the through via 253 of the intermediate circuit layer 25. That is, the conductive via 223 is configured to electrically connect the double side module 22 to the intermediate circuit layer 25. Further, as stated above, the intermediate layer 25 electrically connects to the double side module 21 by the through via 253, and thus the double side module 22 electrically connects to the double side module 21 by the conductive via 223, the intermediate circuit layer 25 and the through via 253. In addition, the conductive via 223 may further include a seed layer 2231.

In some embodiments of the present disclosure, the double side module 22 includes a conductive via 225 extending from the circuit layer 221 to the circuit layer 210. Referring to FIG. 2, the conductive via 225 extends through the circuit layer 221 and the adhesion layers 227 and 213. Since the intermediate circuit layer 25 is smaller than the circuit layer 221 from a top view perspective and the intermediate circuit layer 25 is smaller than the circuit layer 210 from a top view perspective, the conductive via 225 may directly extend from the circuit layer 221 to the circuit layer 210 and bypass the intermediate circuit layer 25. That is, the conductive via 225 does not contact the intermediate circuit layer 25.

The conductive via 225 may connect the interconnection layer 2210 of the circuit layer 221 and the interconnection layer 2105 of the circuit layer 210. Thus, the conductive via 225 is configured to electrically connect the double side module 22 to the double side module 21. In other words, the double side module 22 electrically connects the double side module 21 by the conductive via 225. Moreover, the conductive via 225 may include a seed layer 2251.

As shown in FIG. 2, the double side module 23 is stacked and disposed on the double side module 21. The double side module 23 may include a circuit layer 231, electronic components 2301, 2303, 2305, an adhesion layer 237 and electrical connections 239. The circuit layer 231 may include a dielectric layer 2319 and an interconnection layer 2310 at least partially embedded in the dielectric layer 2319.

Referring to FIG. 2, the circuit layer 231 includes a surface 2311 (e.g., an upper surface) facing the double side module 21. The electronic components 2301, 2303, 2305 are disposed or mounted on the surface 2311 of the circuit layer 231 and electrically connect to the interconnection layer 2310 of the circuit layer 231. The electronic components 2301, 2303 and 2305 may be a die, an active device, a passive device, and/or other electronic devices. The adhesion layer 237 may cover or encapsulate the surface 2311 of the circuit layer 231 and the electronic components 2301, 2303, 2305. In some embodiments of the present disclosure, the adhesion layer 237 may include a liquid adhesion. In some embodiments of the present disclosure, the adhesion layer 237 may include an adhesive tape. In some embodiments of the present disclosure, the adhesion layer 237 may include an adhesive film. Further, referring to FIG. 2, the circuit layer 231 includes a surface 2312 (e.g., a lower surface) facing away from the double side module 21. The electrical connections 239 are disposed or mounted on the surface 2312 of the circuit layer 231 and electrically connect the interconnection layer 2310 of the circuit layer 231. The electrical connection 239 may include a solder ball or a solder bump such as a C4 bump.

As shown in FIG. 2, an intermediate circuit layer 27 is arranged between the double side module 21 and the double side module 23. Thus, the intermediate circuit layer 27 is disposed on the double side module 21, and the double side module 23 is disposed on the intermediate circuit layer 27. That is, the intermediate circuit layer 27 includes a surface 278 (e.g., an upper surface) facing the double side module 21 and a surface 279 (e.g., a lower surface) facing the double side module 23. In some embodiments of the present disclosure, the intermediate circuit layer 27 includes a dielectric layer 271 and an interconnection layer 272 at least partially embedded in the dielectric layer 271. The dielectric layer 271 may include an inorganic material, such as silicon. In some embodiments of the present disclosure, the intermediate circuit layer 27 further include a through via 273 extending to the circuit layer 210. The through via 273 may connect the interconnection layer 272 of the intermediate circuit layer 27 and the interconnection layer 2105 of the circuit layer 210. Thus, the through via 273 is configured to electrically connect the intermediate circuit layer 27 to the double side module 21. In addition, the intermediate circuit 27 may further include a seed layer 275. The seed layer 275 may be arranged between the dielectric layer 271 and the interconnection layer 272 and/or on the sidewall of the through via 273.

As shown in FIG. 2, there is no electronic component mounted on the intermediate circuit layer 27. That is, both surfaces of the intermediate circuit layer 27 are free from an electronic component.

In some embodiments of the present disclosure, an area occupied by the intermediate circuit layer 27 is smaller than an area occupied by the circuit layer 210. That is, the intermediate circuit layer 27 is smaller than the circuit layer 210 from a top view perspective. In some embodiments of the present disclosure, a projection area of the intermediate circuit layer 27 on the surface 2102 of the circuit layer 210 is smaller than an area of the surface 2102 of the circuit layer 210. In some embodiments of the present disclosure, the projection area of the intermediate circuit layer 27 on the surface 2102 of the circuit layer 210 is included in the area of the surface 2102 of the circuit layer 210. A side surface 277 of the intermediate circuit layer 27 may not be coplanar with a side surface 2107 of the circuit layer 210. In some embodiments of the present disclosure, the area occupied by the intermediate circuit layer 27 is smaller than an area occupied by the circuit layer 231. That is, the intermediate circuit layer 27 is smaller than the circuit layer 231 from a top view perspective. In some embodiments of the present disclosure, a projection area of the intermediate circuit layer 27 on the surface 2102 of the circuit layer 210 is smaller than a projection area of the circuit layer 231 on the surface 2102 of the circuit layer 210. In some embodiments of the present disclosure, the projection area of the intermediate circuit layer 27 on the surface 2102 of the circuit layer 210 is included in the projection area of the circuit layer 231 on the surface 2102 of the circuit layer 210. The side surface 277 of the intermediate circuit layer 25 may not be coplanar with a side surface 2313 of the circuit layer 231. Referring to FIG. 2, the adhesion layer 215 may cover the side surfaces 277 and the surface 278 of the intermediate layer 27 and the adhesion layer 237 may cover the surface 279 of the intermediate layer 27. Moreover, the adhesion layer 217 may directly contact the adhesion layer 237.

Moreover, the double side module 23 may include a conductive via 233 extending from the circuit layer 231 to the intermediate circuit layer 27. Referring to FIG. 2, the conductive via 233 extends through the circuit layer 231 to the intermediate circuit layer 27. The conductive via 233 may connect the interconnection layer 2310 of the circuit layer 231 and the interconnection layer 272 and/or the through via 273 of the intermediate circuit layer 27. That is, the conductive via 233 is configured to electrically connect the double side module 23 to the intermediate circuit layer 27. Further, as stated above, the intermediate layer 27 electrically connects to the double side module 21 by the through via 273, and thus the double side module 23 electrically connects to the double side module 21 by the conductive via 233, the intermediate circuit layer 27 and the through via 273. In addition, the conductive via 233 may further include a seed layer 2331.

In some embodiments of the present disclosure, the double side module 23 includes a conductive via 235 extending from the circuit layer 231 to the circuit layer 210. Referring to FIG. 2, the conductive via 235 extends through the circuit layer 231 and the adhesion layers 237 and 215. Since the intermediate circuit layer 27 is smaller than the circuit layer 231 from a top view perspective and the intermediate circuit layer 27 is smaller than the circuit layer 210 from a top view perspective, the conductive via 235 may directly extend from the circuit layer 231 to the circuit layer 210 and bypass the intermediate circuit layer 27. That is, the conductive via 235 does not contact the intermediate circuit layer 27.

The conductive via 235 may connect the interconnection layer 2310 of the circuit layer 231 and the interconnection layer 2105 of the circuit layer 210. Thus, the conductive via 235 is configured to electrically connect the double side module 23 to the double side module 21. In other words, the double side module 23 electrically connects the double side module 21 by the conductive via 235. Moreover, the conductive via 235 may include a seed layer 2351.

FIG. 3A, FIG. 3B, FIG. 3C, FIG. 3D, FIG. 3E, FIG. 3F, FIG. 3G, FIG. 3H, FIG. 3I, FIG. 3J. FIG. 3K, FIG. 3L, FIG. 3M and FIG. 3N illustrate a method of manufacturing a semiconductor device package 3 in accordance with another embodiment of the instant disclosure.

Figure 3A:
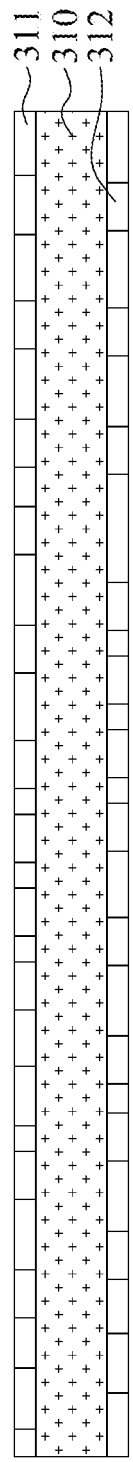
FIG. 3A, FIG. 3B, FIG. 3C, FIG. 3D, FIG. 3E, FIG. 3F, FIG. 3G, FIG. 3H, FIG. 3I, FIG. 3J.

Referring to FIG. 3A, a conductive substrate 310 is provided. The conductive substrate 310 includes circuit layers 311 and 312. The circuit layers 311 and 312 are adjacent to the opposite sides of the conductive substrate 310 respectively.

Figure 3B:
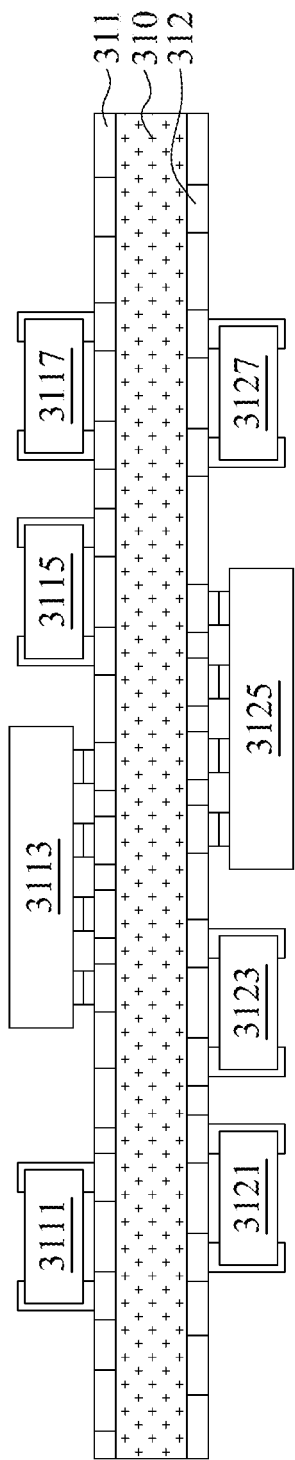

Referring to FIG. 3B, electronic components 3111, 3113, 3115 and 3117 are disposed and mounted on the circuit layer 311 of the conductive substrate 310 and electrically connect the circuit layer 311 of the conductive substrate 310. Electronic components 3121, 3123, 3125 and 3127 are disposed and mounted on the circuit layer 312 of the conductive substrate 310 and electrically connect the circuit layer 312 of the conductive substrate 310.

Figure 3C:
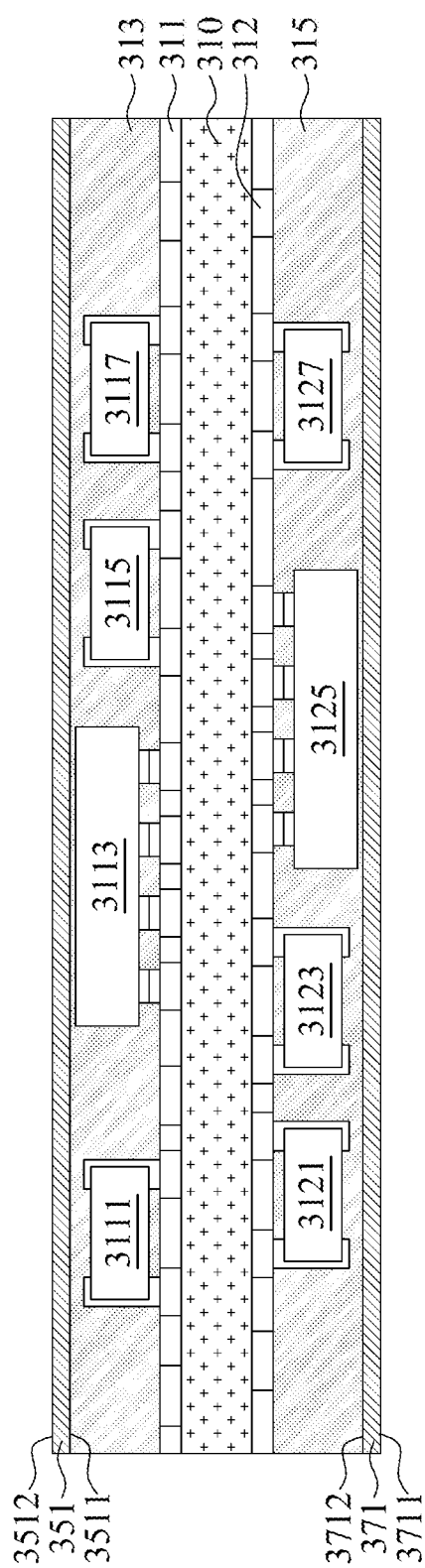

Referring to FIG. 3C, a dielectric layer 351 is bounded to the conductive substrate 310 by an adhesion layer 313. The adhesion layer 313 substantially encapsulates and covers the circuit layer 311 and the electronic components 3111, 3113, 3115 and 3117. A dielectric layer 371 is bounded to the conductive substrate 310 by an adhesion layer 315. The adhesion layer 315 substantially encapsulates and covers the circuit layer 312 and the electronic components 3121, 3123, 3125 and 3127. The dielectric layer 351 and the dielectric layer 371 may include an organic material, such as a polyamide (PA).

Figure 3D:
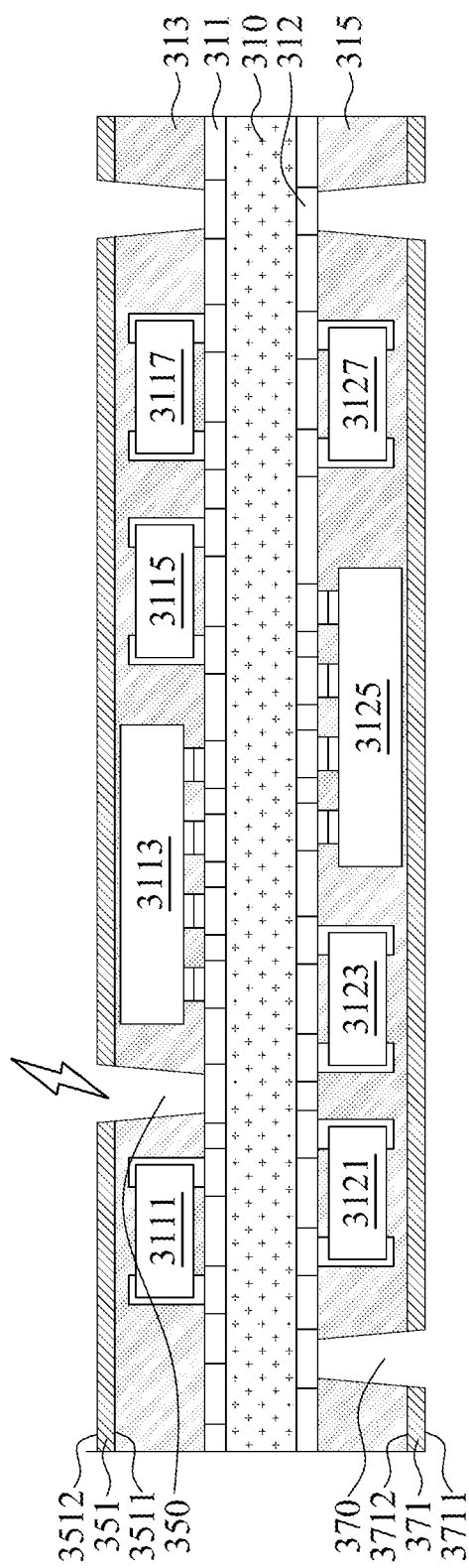

Referring to FIG. 3D, a laser operation may be carried out such that a portion of the dielectric layer 351 and a portion of the adhesion layer 313 are removed by the laser operation. After the laser operation, a tapered through hole 350 is formed and a portion of the circuit layer 311 is exposed. Further, the laser operation may also cause a portion of the dielectric layer 371 and a portion of the adhesion layer 315 to be removed. After the laser operation, a tapered through hole 370 is formed and a portion of the circuit layer 312 is exposed.

Figure 3E:
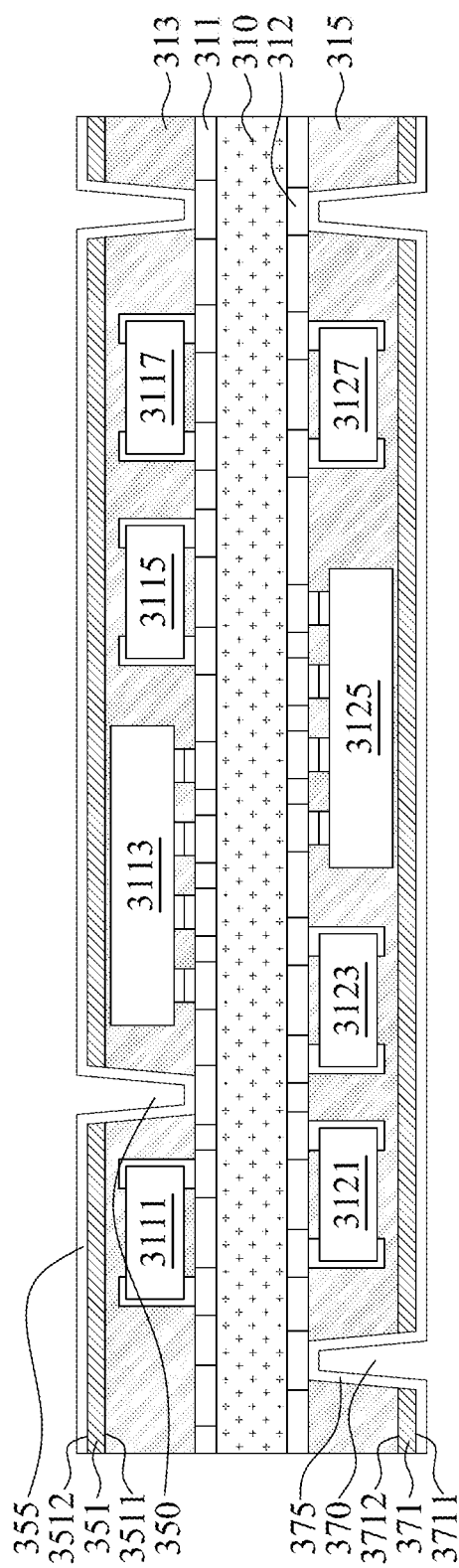

Referring to FIG. 3E, a seed layer 355 is formed on the dielectric layer 351 and inner walls of the through holes 350. Further, a seed layer 375 is formed on the dielectric layer 371 and inner walls of the through holes 370.

Figure 3F:
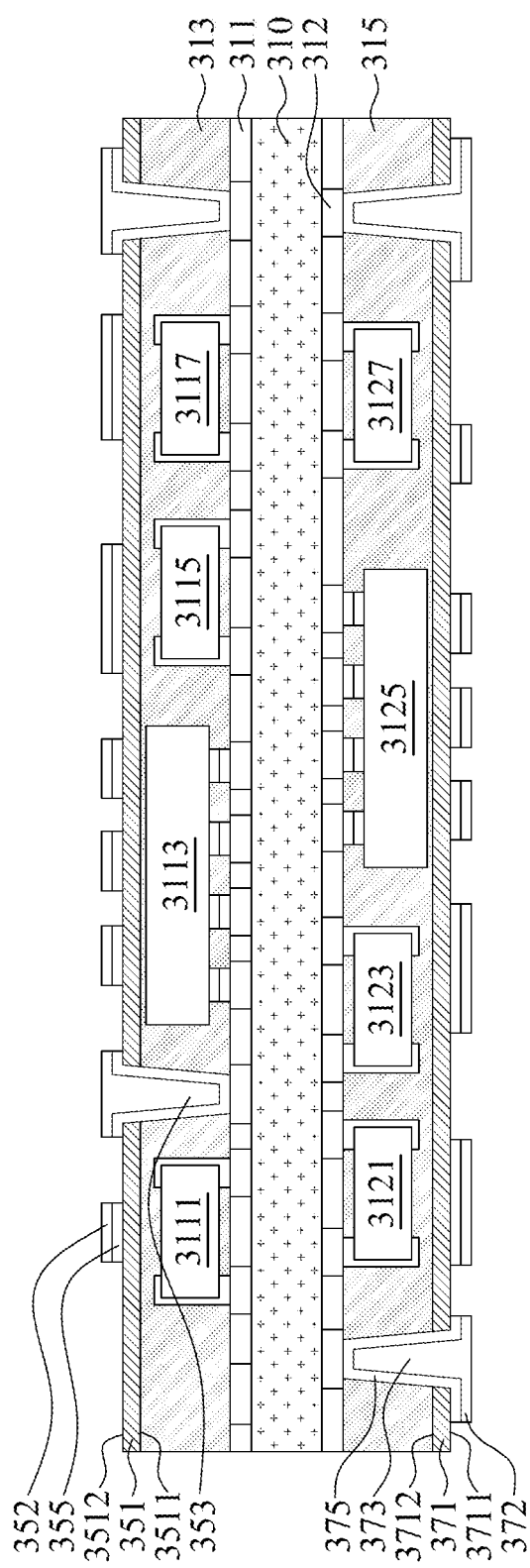

Referring to FIG. 3F, an interconnection layer 352 is formed on the dielectric layer 351 and a through via 353 is formed in the through hole 350, for example by photolithography and etching processes. Moreover, the seed layer 335 is disposed between the interconnection layer 352 and the dielectric layer 351 and on the sidewall of the through via 353. The through via 353 may extend to the circuit layer 311 and thus may electrically connect the circuit layer 311. An interconnection layer 372 is formed on the dielectric layer 371 and a through via 373 is formed in the through hole 370, for example by photolithography and etching processes. Moreover, the seed layer 375 is disposed between the interconnection layer 372 and the dielectric layer 371 and on the sidewall of the through via 37. The through via 373 may extend to the circuit layer 312 and thus may electrically connect the circuit layer 312.

Figure 3G:
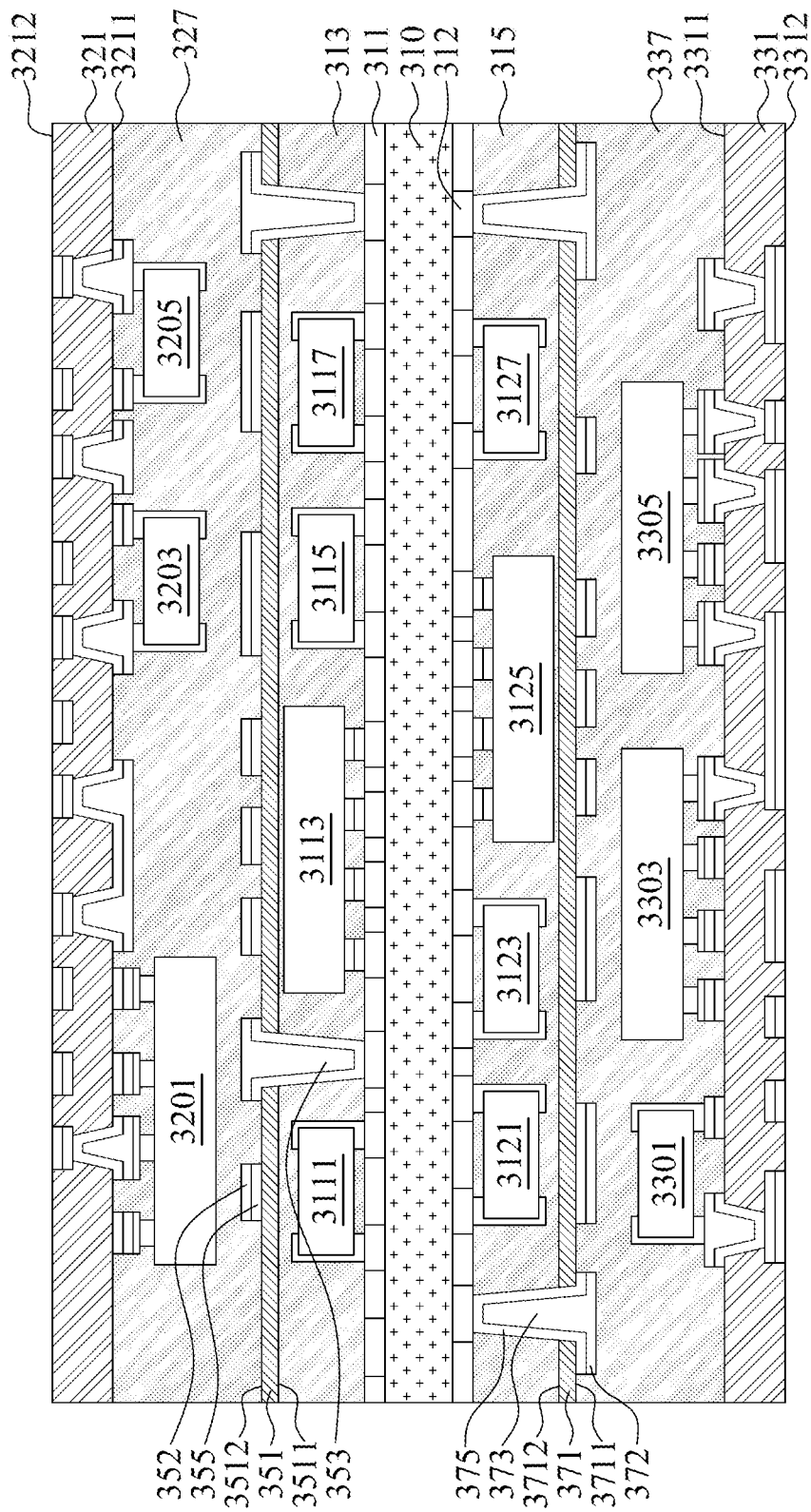

Referring to FIG. 3G, a circuit layer 321 with electronic components 3201, 3203 and 3205 is bounded to the dielectric layer 351 by an adhesion layer 327. The electronic components 3201, 3203 and 3205 are disposed and mounted on the surface 3211 of the circuit layer 321, which faces the dielectric layer 351, and electrically connect to the circuit layer 321. Further, the electronic components 3201, 3203 and 3205 are encapsulated by the adhesion layer 327. A circuit layer 331 with electronic components 3301, 3303 and 3305 is bounded to the dielectric layer 371 by an adhesion layer 337. The electronic components 3301, 3303 and 3305 are disposed and mounted on the surface 3311 of the circuit layer 331, which faces the dielectric layer 371, and electrically connect to the circuit layer 331. Further, the electronic components 3301, 3303 and 3305 are encapsulated by the adhesion layer 337.

Figure 3H:
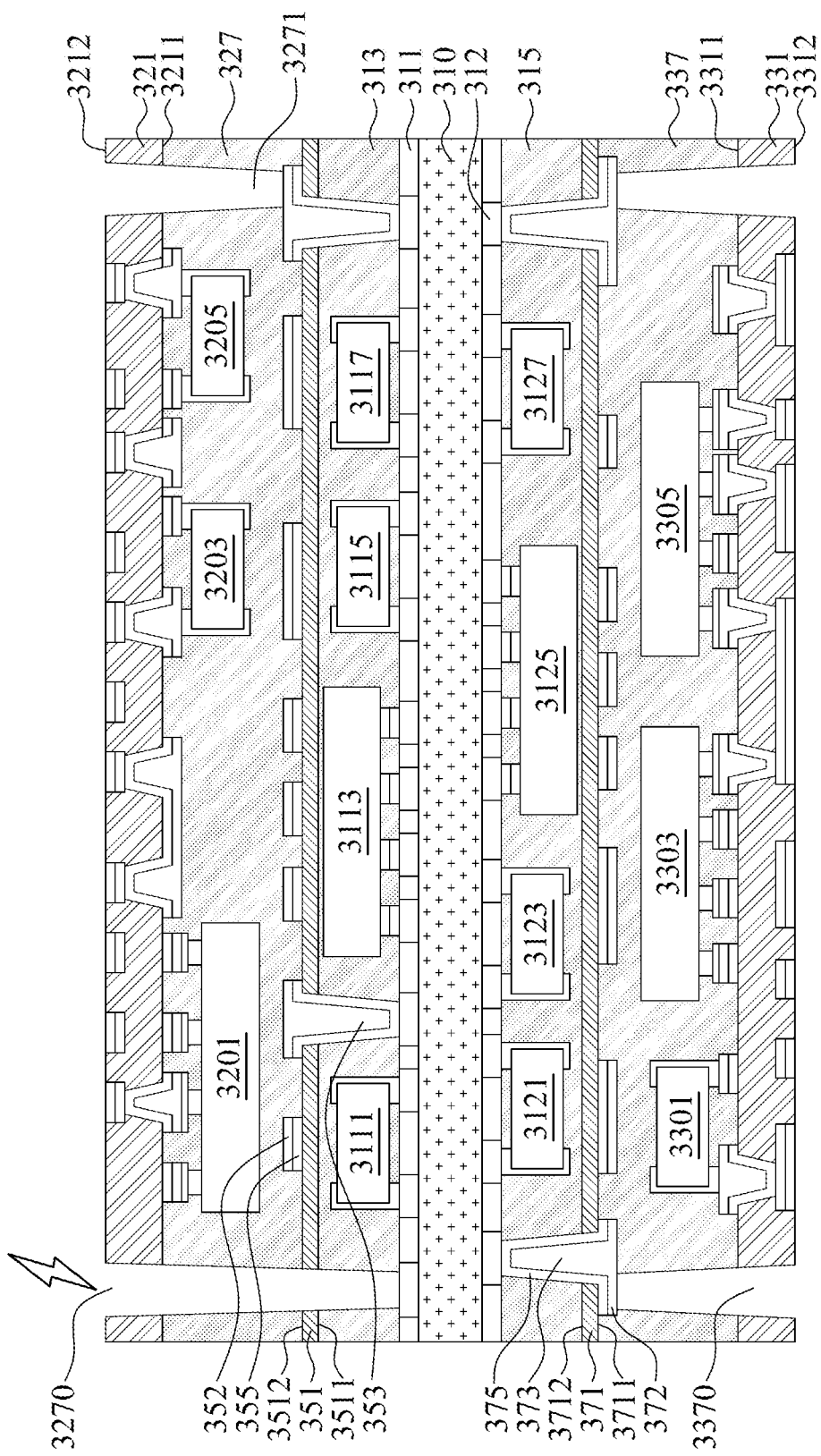

Referring to FIG. 3H, a laser operation may be carried out such that a portion of the circuit layer 321, a portion of the adhesion layer 327, a portion of the dielectric layer 351 and a portion of the adhesion layer 315 are removed by the laser operation. After the laser operation, a tapered through hole 3270 is formed and a portion of circuit layer 311 is exposed. The laser operation may also cause a portion of the circuit layer 321 and a portion of the adhesion layer 327 to be removed. After the laser operation, a tapered through hole 3271 is formed and a portion of interconnection layer 352 is exposed. Moreover, the laser operation may also cause a portion of the circuit layer 331 and a portion of the adhesion layer 337 to be removed. After the laser operation, a tapered through hole 3370 is formed and a portion of interconnection layer 372 is exposed.

Figure 3I:
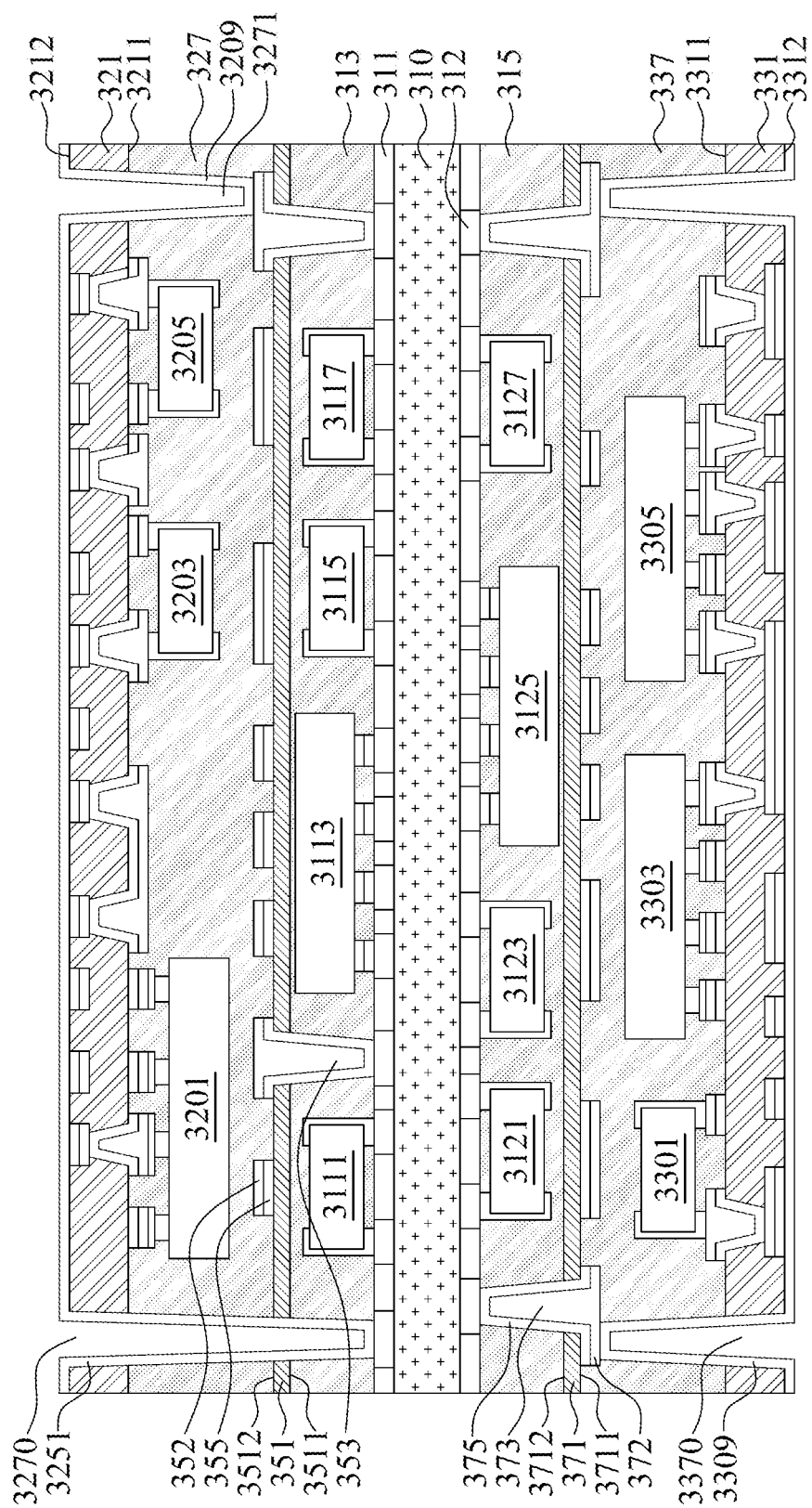

Referring to FIG. 3I, a seed layer 3209 is formed on the surface 3212 of the circuit layer 321, which faces away from the dielectric layer 351, and inner walls of the through holes 3270 and 3271. Further, a seed layer 3309 is formed on the surface 3312 of the circuit layer 331, which faces away from the dielectric layer 371, and inner walls of the through holes 3370.

Figure 3J:
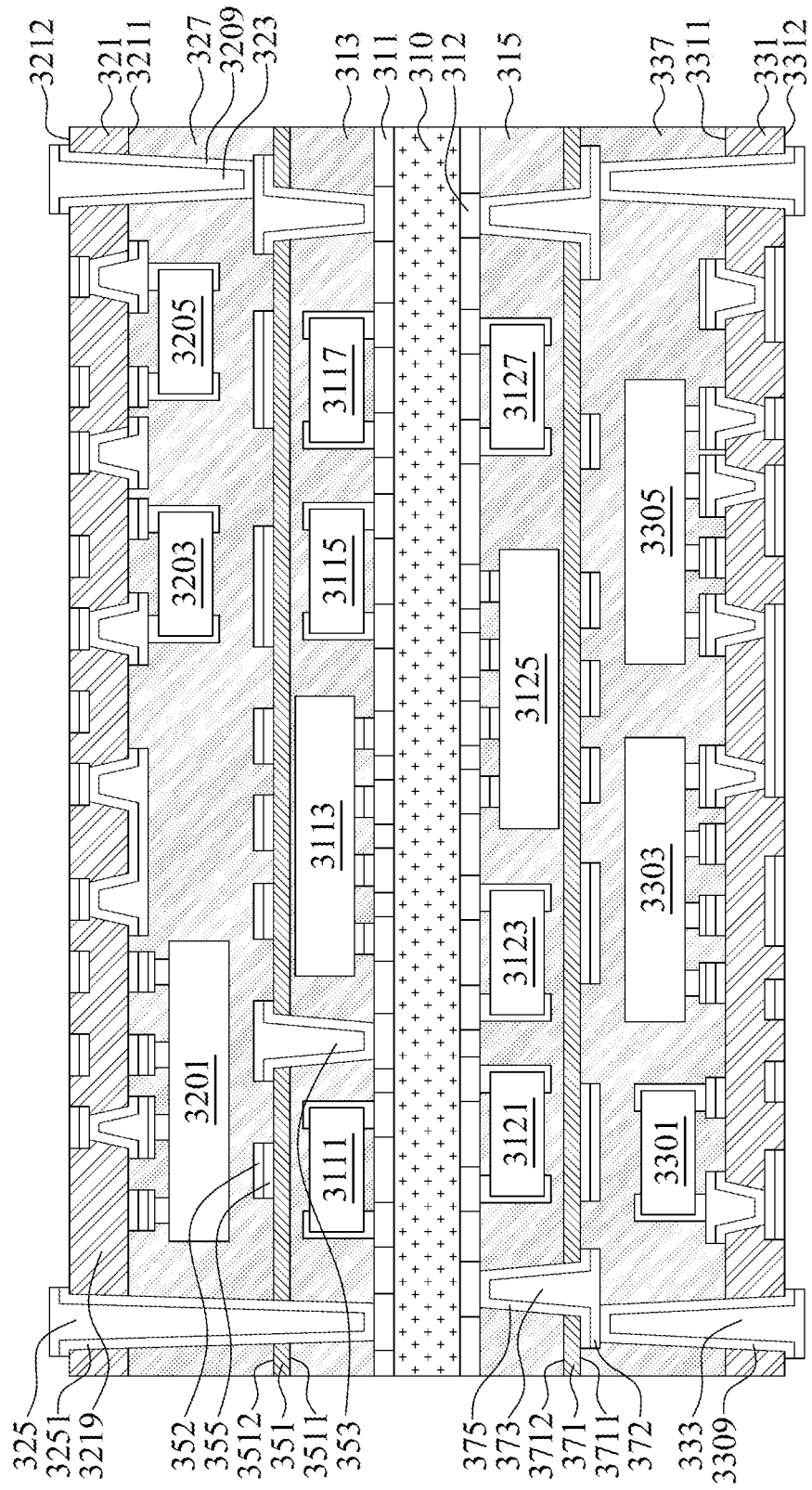

Referring to FIG. 3J, a conductive via 323 is formed in the through hole 3271, a conductive via 325 is formed in the through hole 3270 and conductive vias 333 are formed in the through holes 3370, for example by photolithography and etching processes. The conductive via 325 may extend to the circuit layer 311 and thus may electrically connect to the circuit layer 311. The conductive via 323 may extend to the interconnection layer 352 and/or the through via 353 and thus may electrically connect to the interconnection layer 352 and the through via 353. The conductive via 333 may extend to the interconnection layer 372 and/or the through via 373 and thus may electrically connect to the interconnection layer 372 and the through via 373. In addition, the seed layer 3209 on the surface 3212 of the circuit layer 321 and the seed layer 3309 on the surface 3312 of the circuit layer 331 are removed. Therefore, only the seed layer 3209 disposed on the side walls of the conductive vias 323 and 325 and the seed layer 3309 disposed on the side wall of the conductive via 333 are remained. Moreover, a portion of the interconnection structure of the circuit layer 321 may be exposed on the surface 3212 of the circuit layer 321 by a chemical etching process, and a portion of the interconnection structure of the circuit layer 331 may be exposed on the surface 3312 of the circuit layer 331 by a chemical etching process.

Figure 3K:
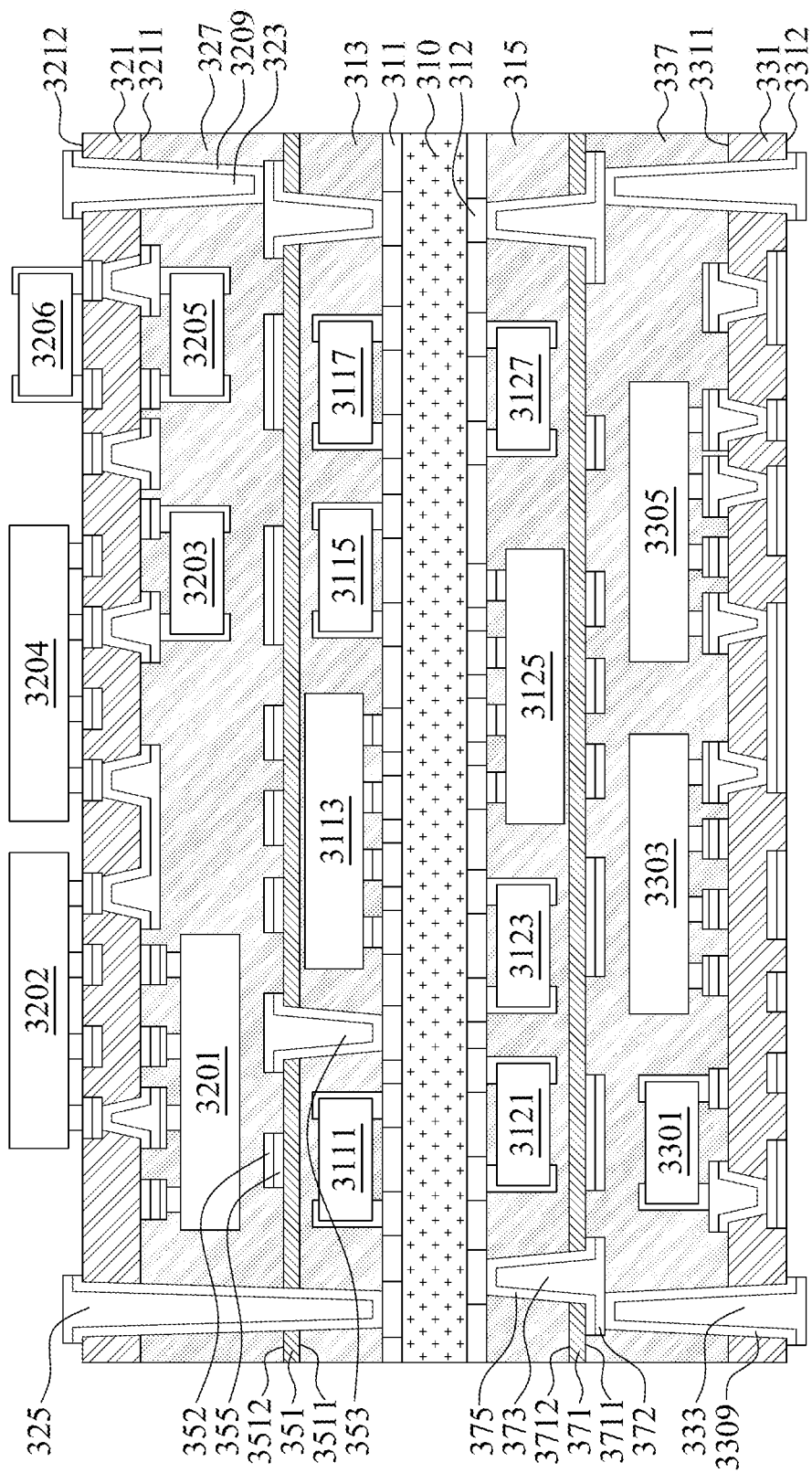
FIG. 3K, FIG. 3L, FIG. 3M and FIG. 3N illustrate a method of manufacturing a semiconductor device package in accordance with another embodiment of the instant disclosure.

Referring to FIG. 3K, electronic components 3202, 3204 and 3206 are disposed or mounted on the surface 3212 of the circuit layer 321 and electrically connect to the circuit layer 321.

Figure 3L:
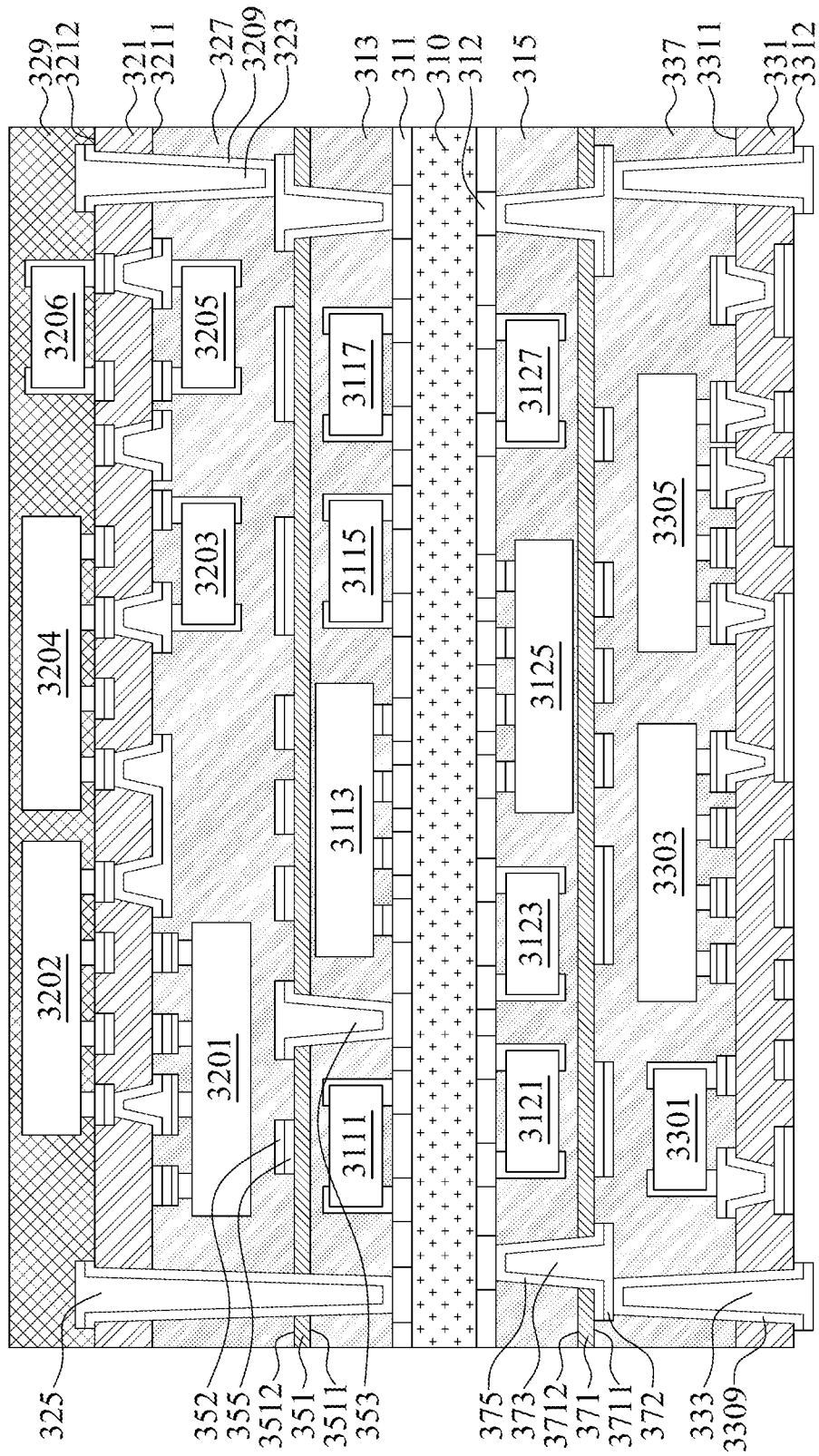

Referring to FIG. 3L, an encapsulant 329 is formed on the circuit layer 3212 and encapsulates or cover the surface 3212 of the circuit layer 321 and the electronic components 3202, 3204 and 3206.

Figure 3M:
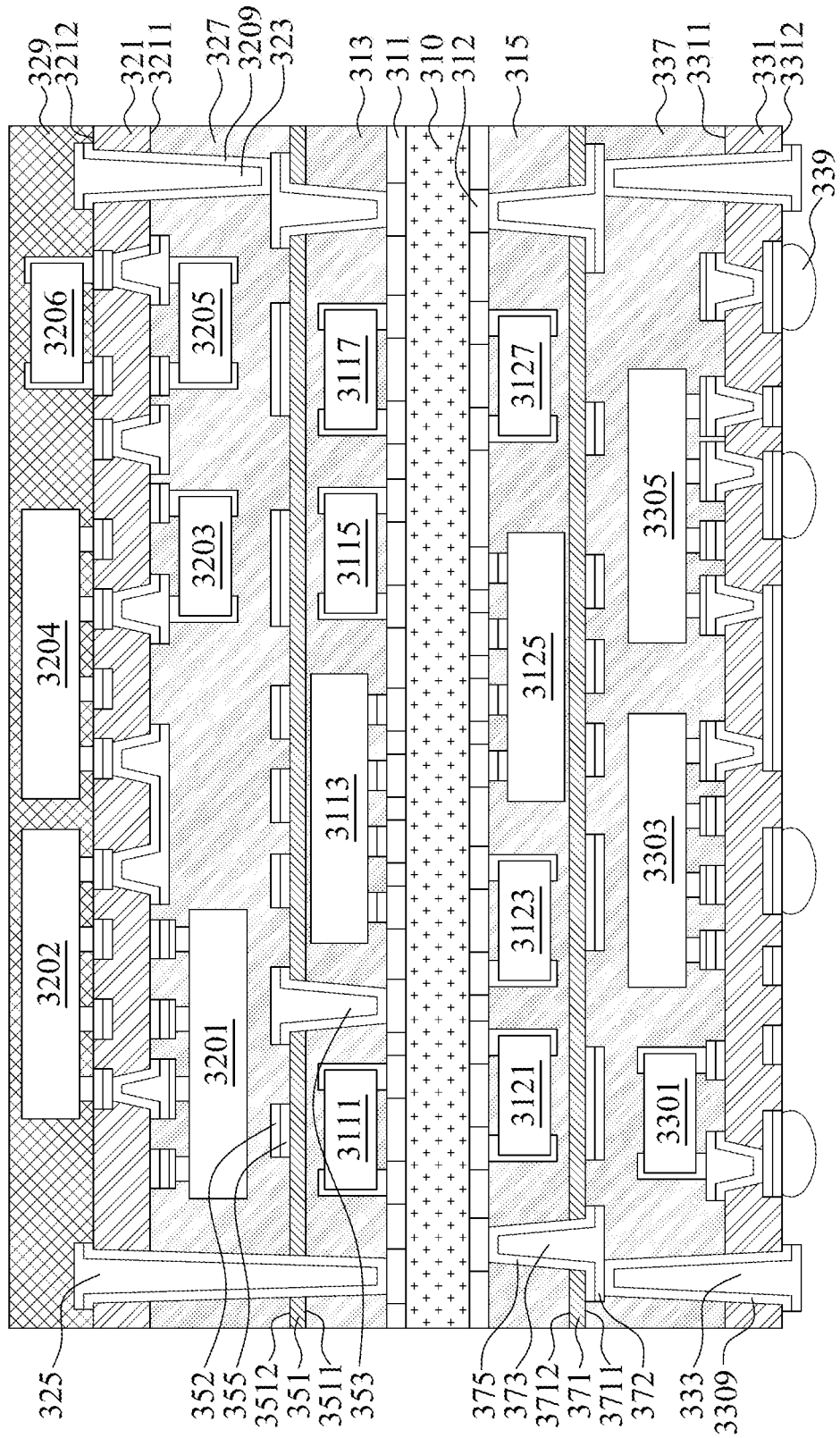

Referring to FIG. 3M, electrical connections 339 are disposed or mounted on the surface of the 3312 of the circuit layer 331 and electrically connect to the circuit layer 331.

Figure 3N:
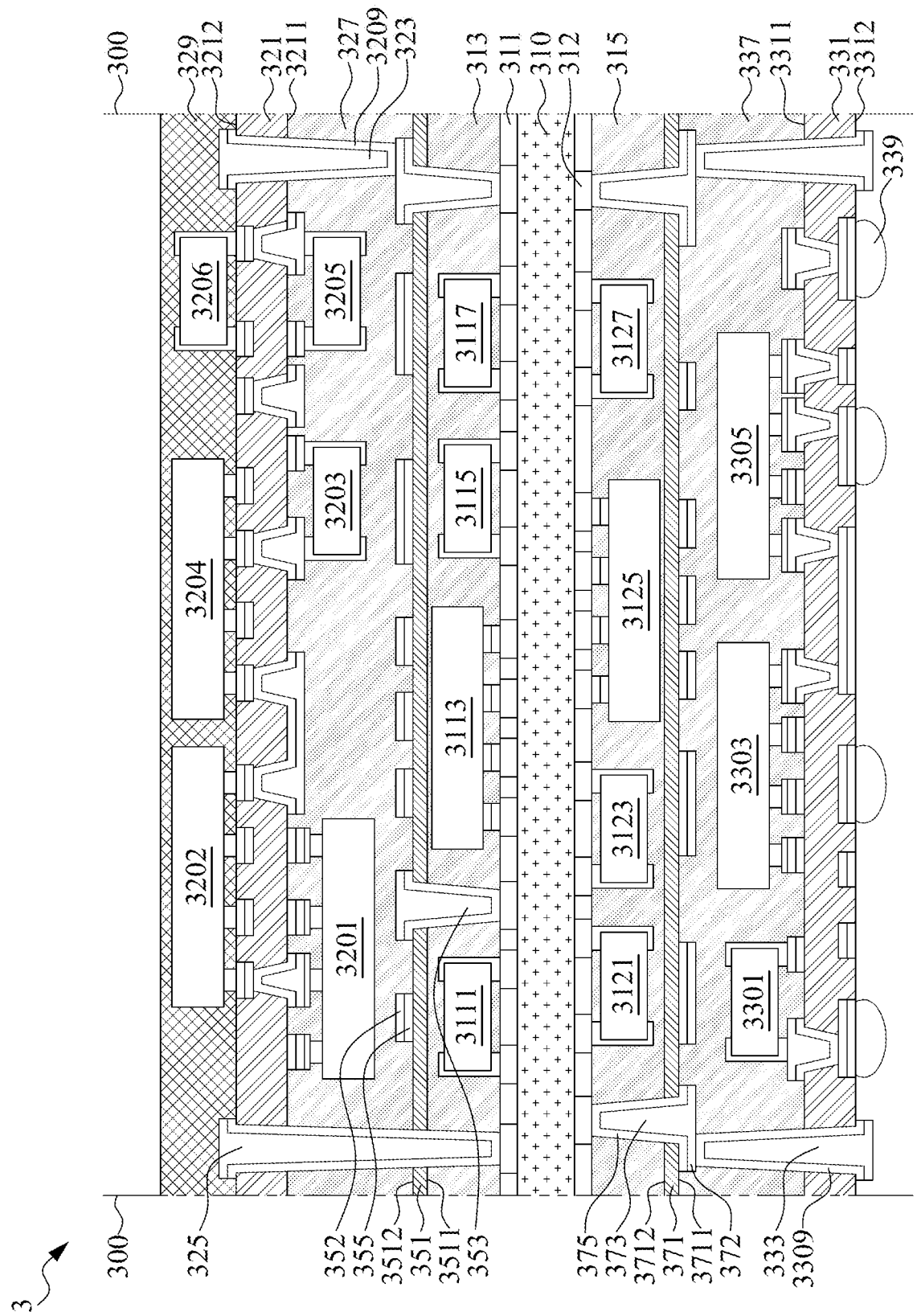

Referring to FIG. 3N, a singulation 300 is performed to form a semiconductor device package 3.

After the manufacturing process as shown in FIG. 3A, FIG. 3B, FIG. 3C, FIG. 3D, FIG. 3E, FIG. 3F, FIG. 3G, FIG. 3H, FIG. 3I, FIG. 3J. FIG. 3K, FIG. 3L, FIG. 3M and FIG. 3N, the semiconductor device package 3 is formed (see FIG. 3N). In some embodiments of the present disclosure, the semiconductor device package 3 is the same as, or similar to, the semiconductor device package 1 shown in FIG. 1.

Figure 4A:
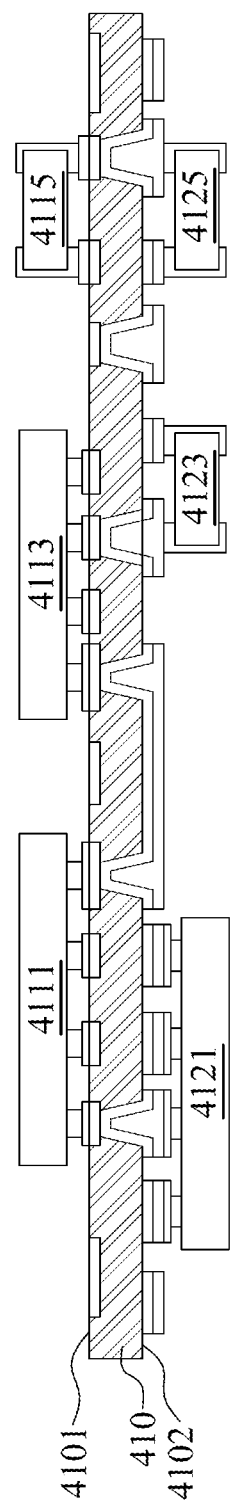
FIG. 4A, FIG. 4B, FIG. 4C, FIG. 4D, FIG. 4E, FIG. 4F, FIG. 4G, FIG. 4H, FIG. 4I, FIG. 4J.
Figure 4B:
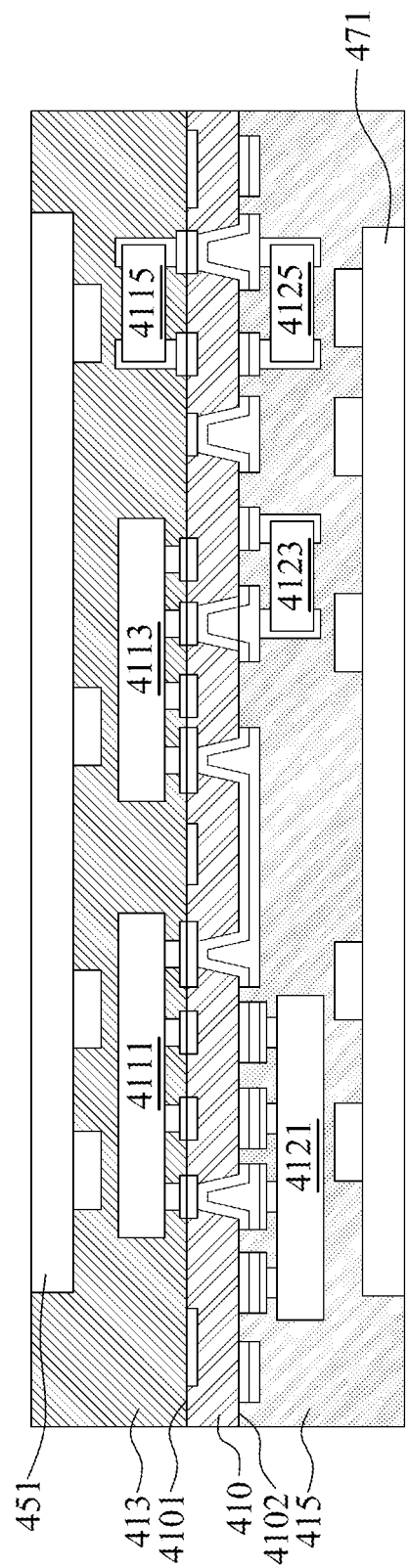
Figure 4C:
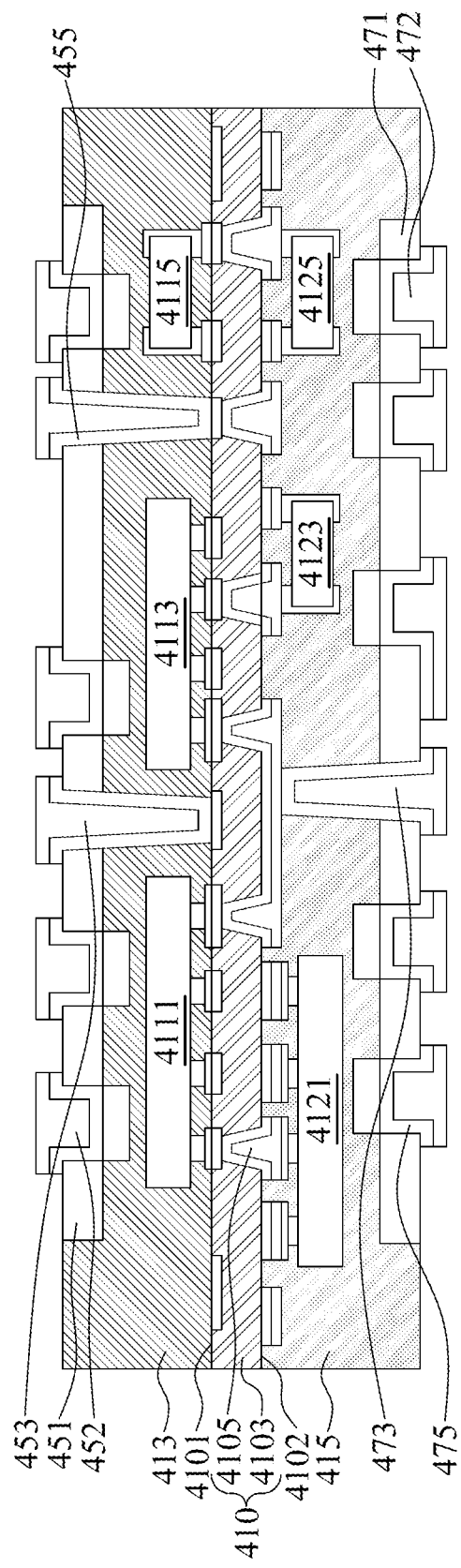
Figure 4D:
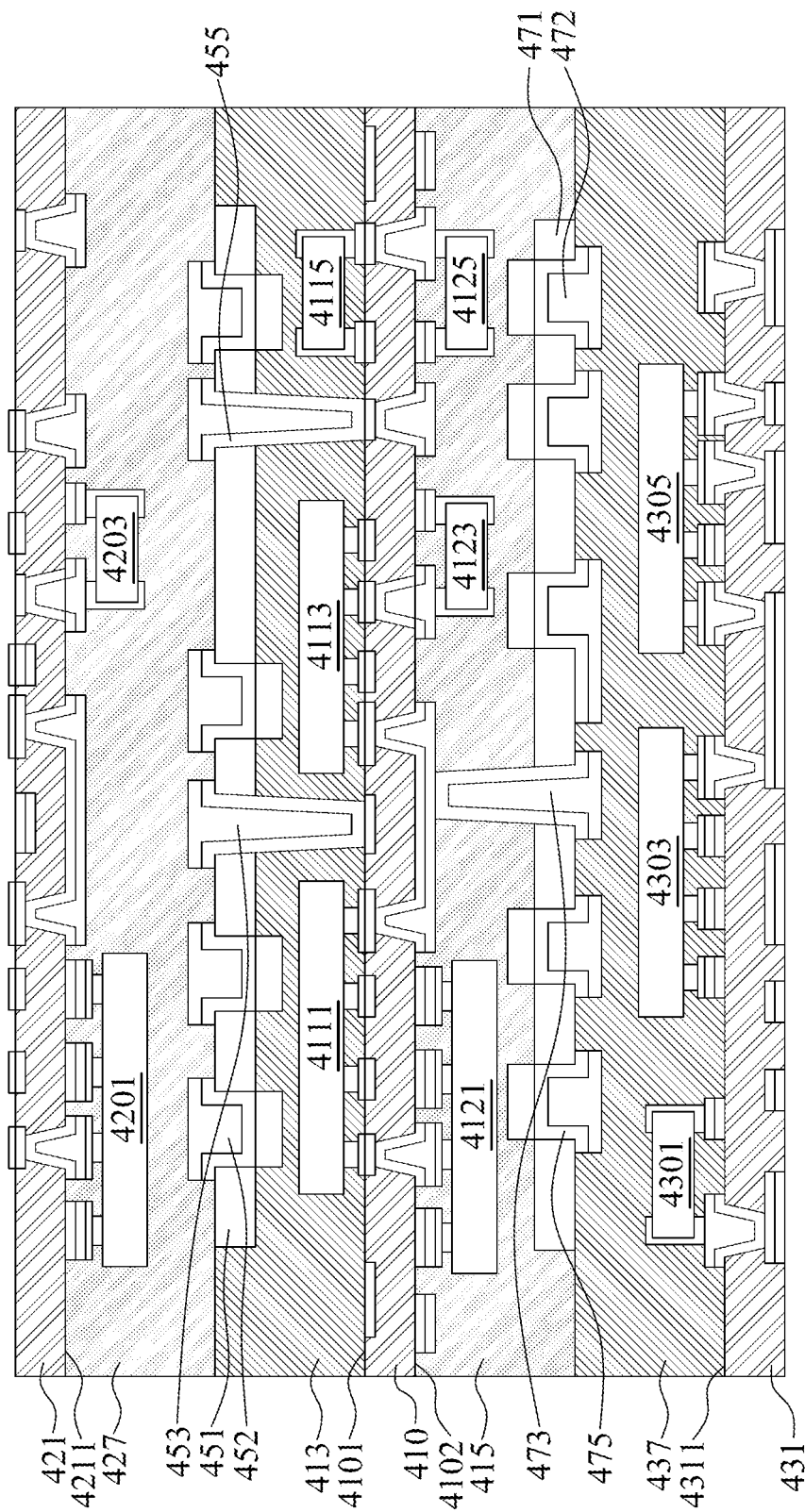
Figure 4E:
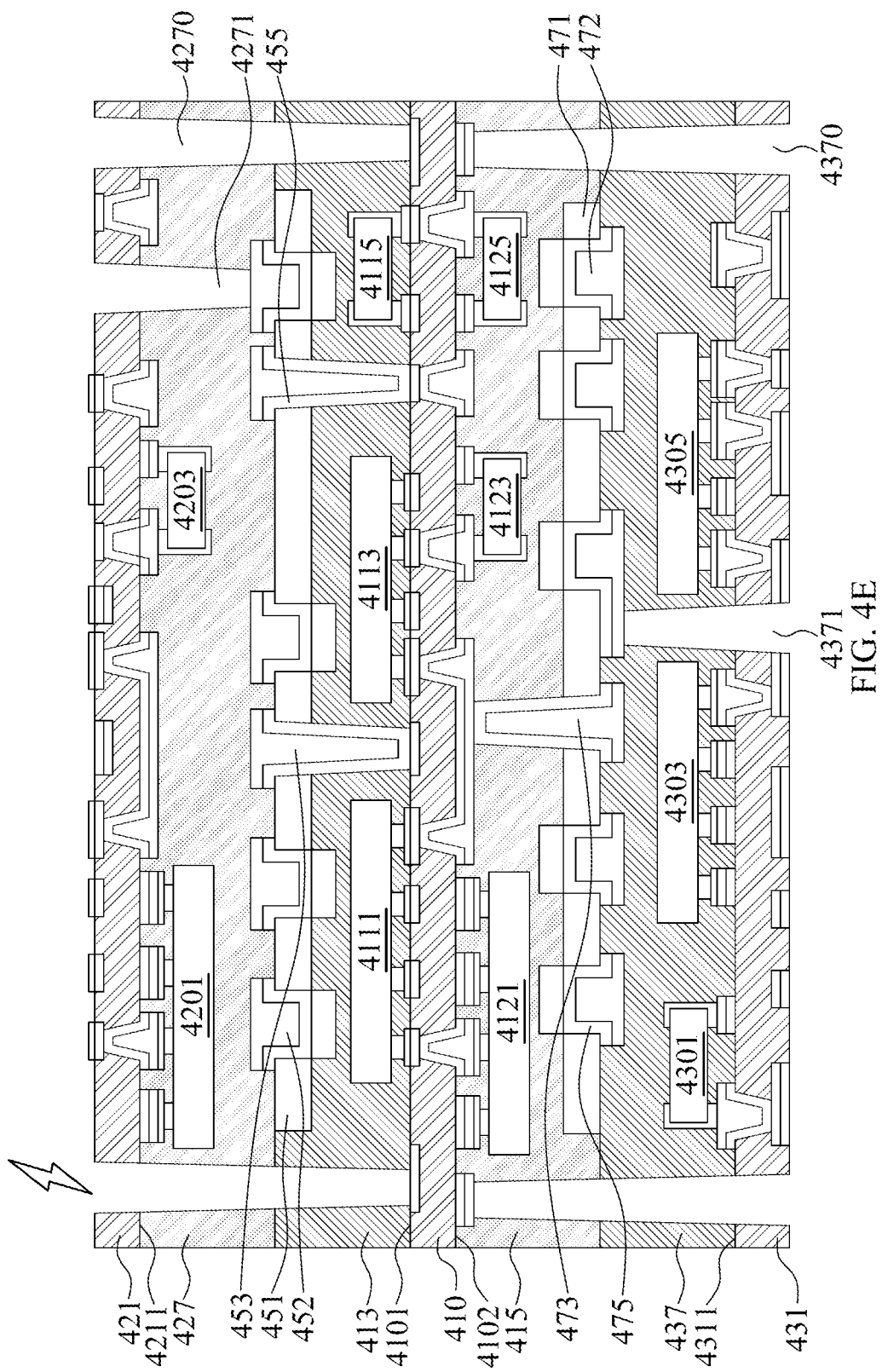
Figure 4F:
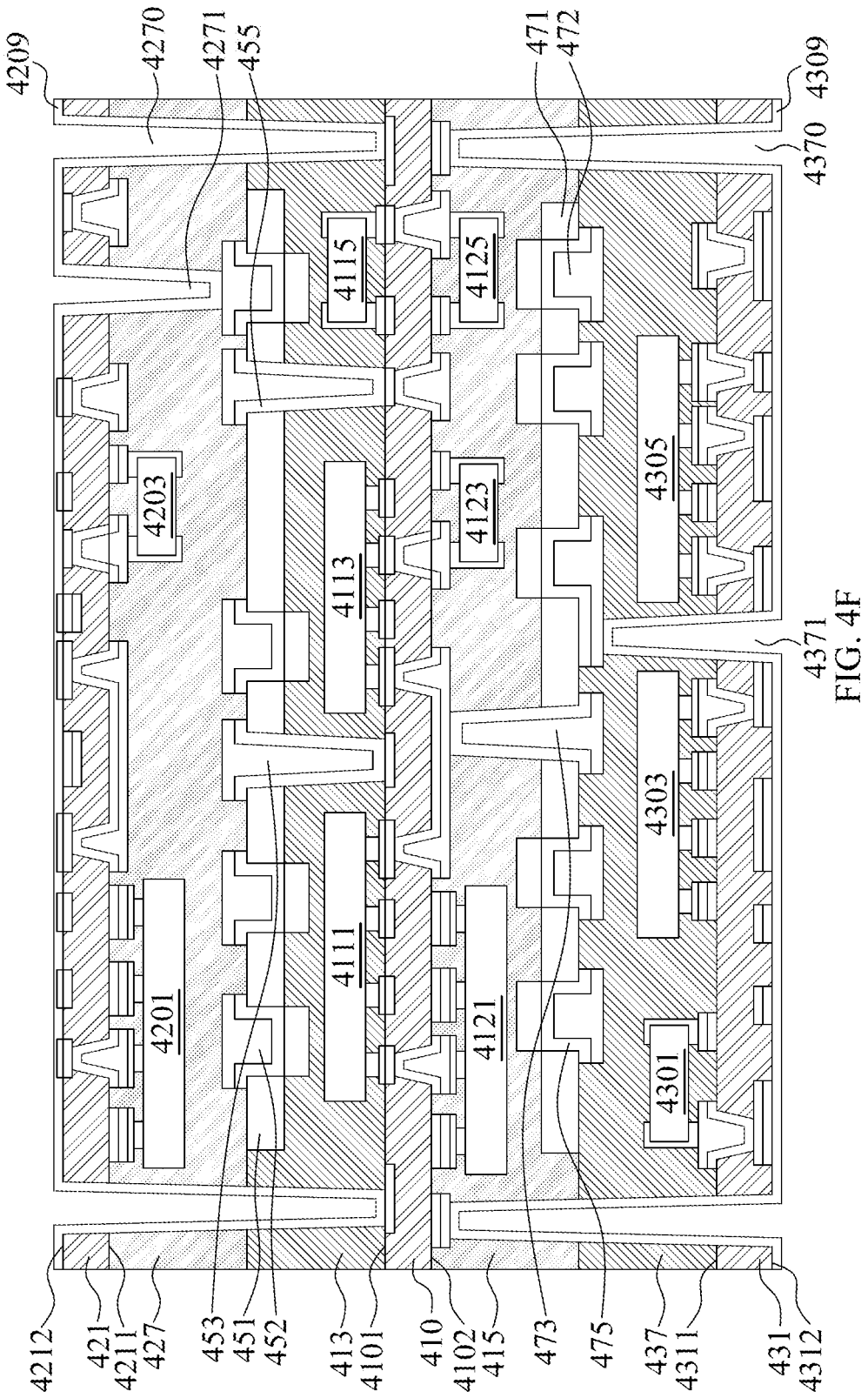
Figure 4G:
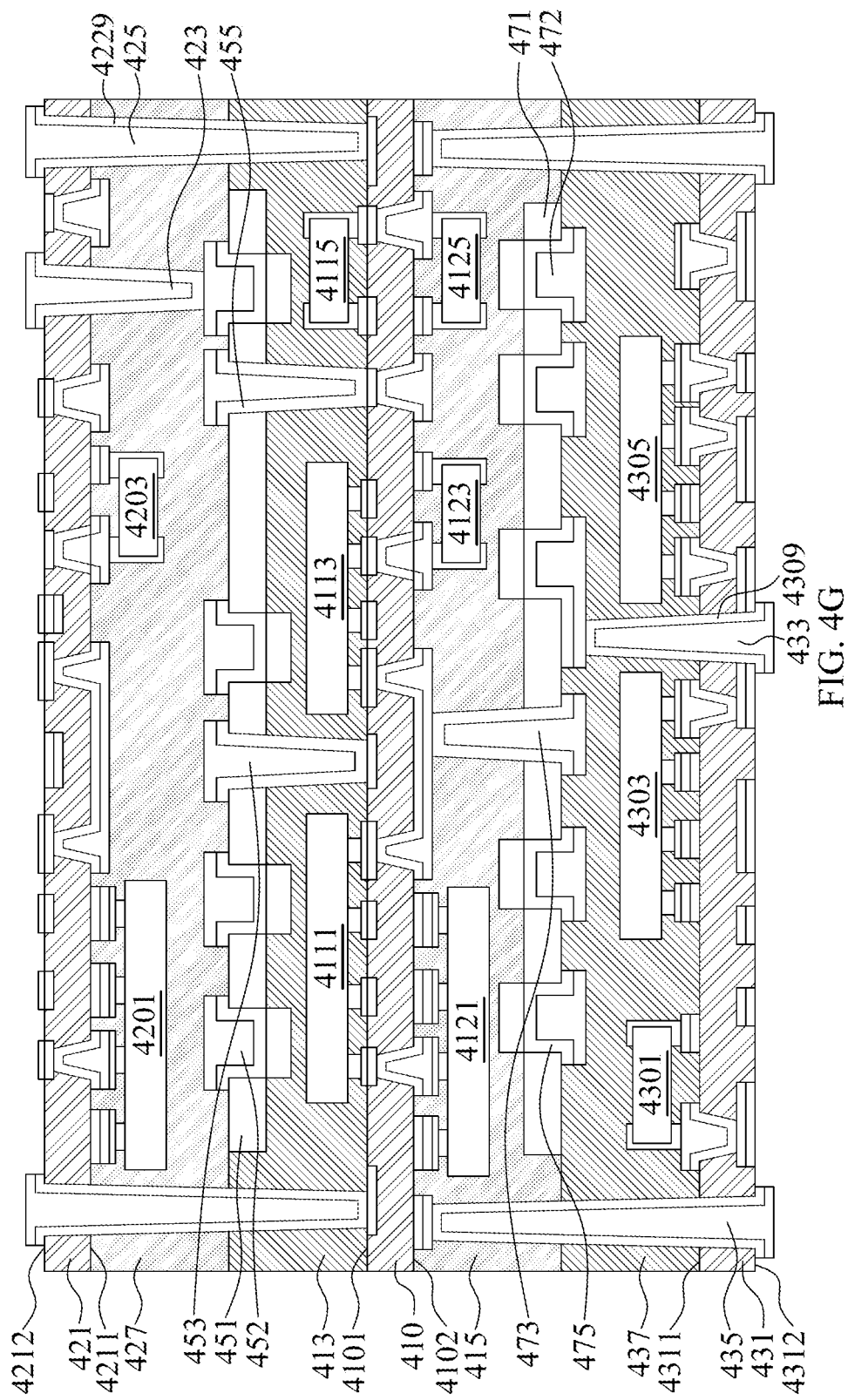
Figure 4H:
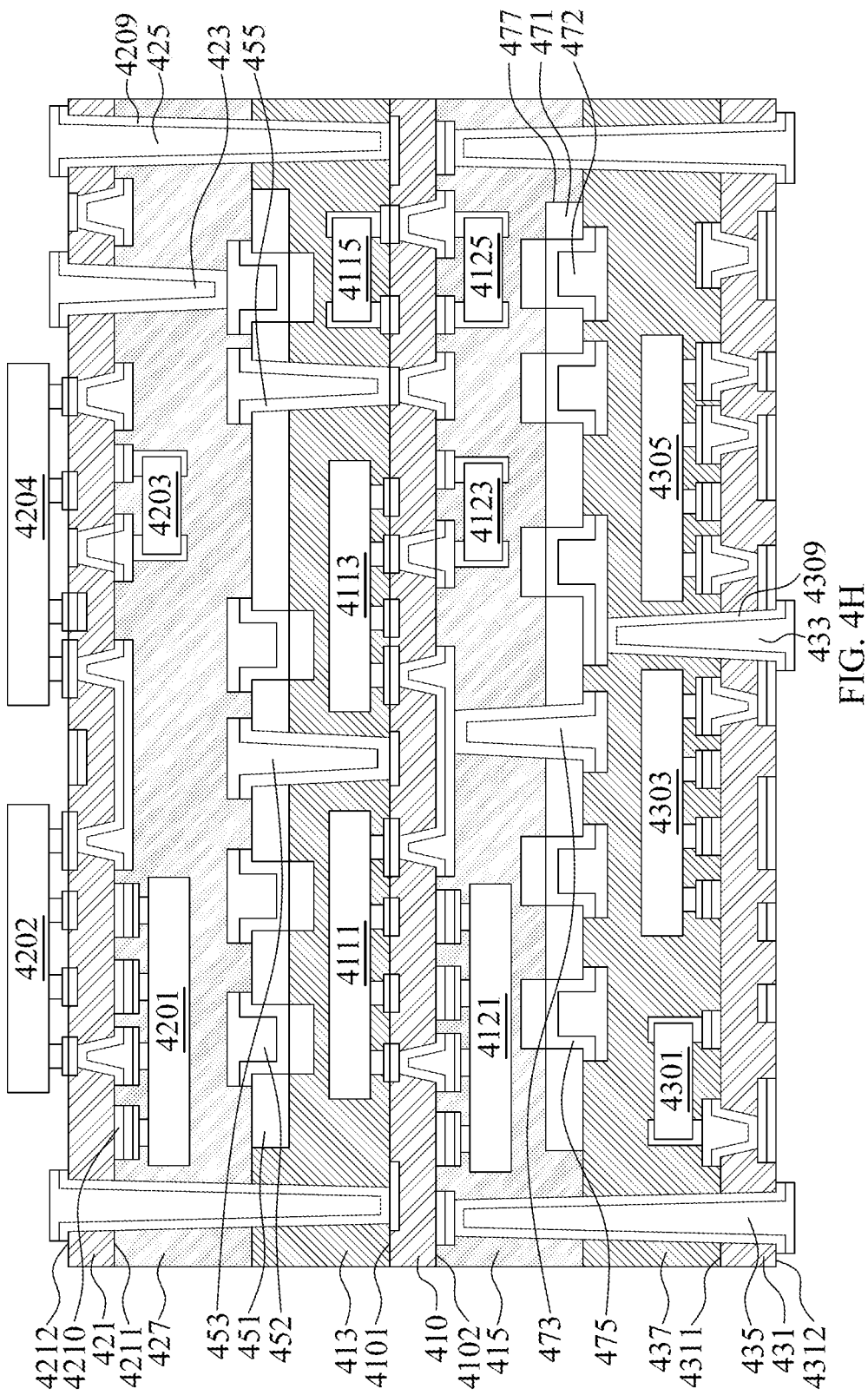
Figure 4I:
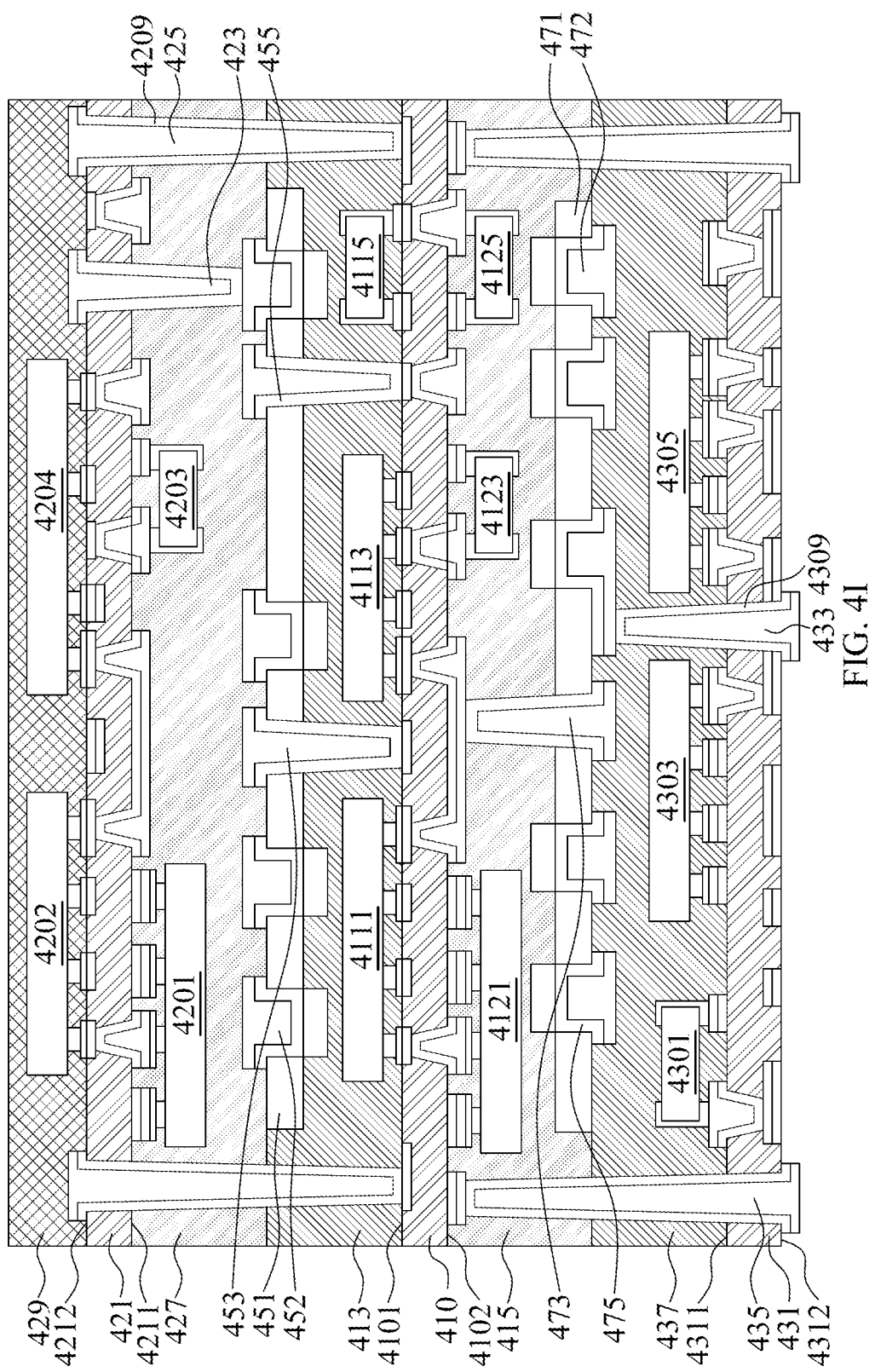
Figure 4J:
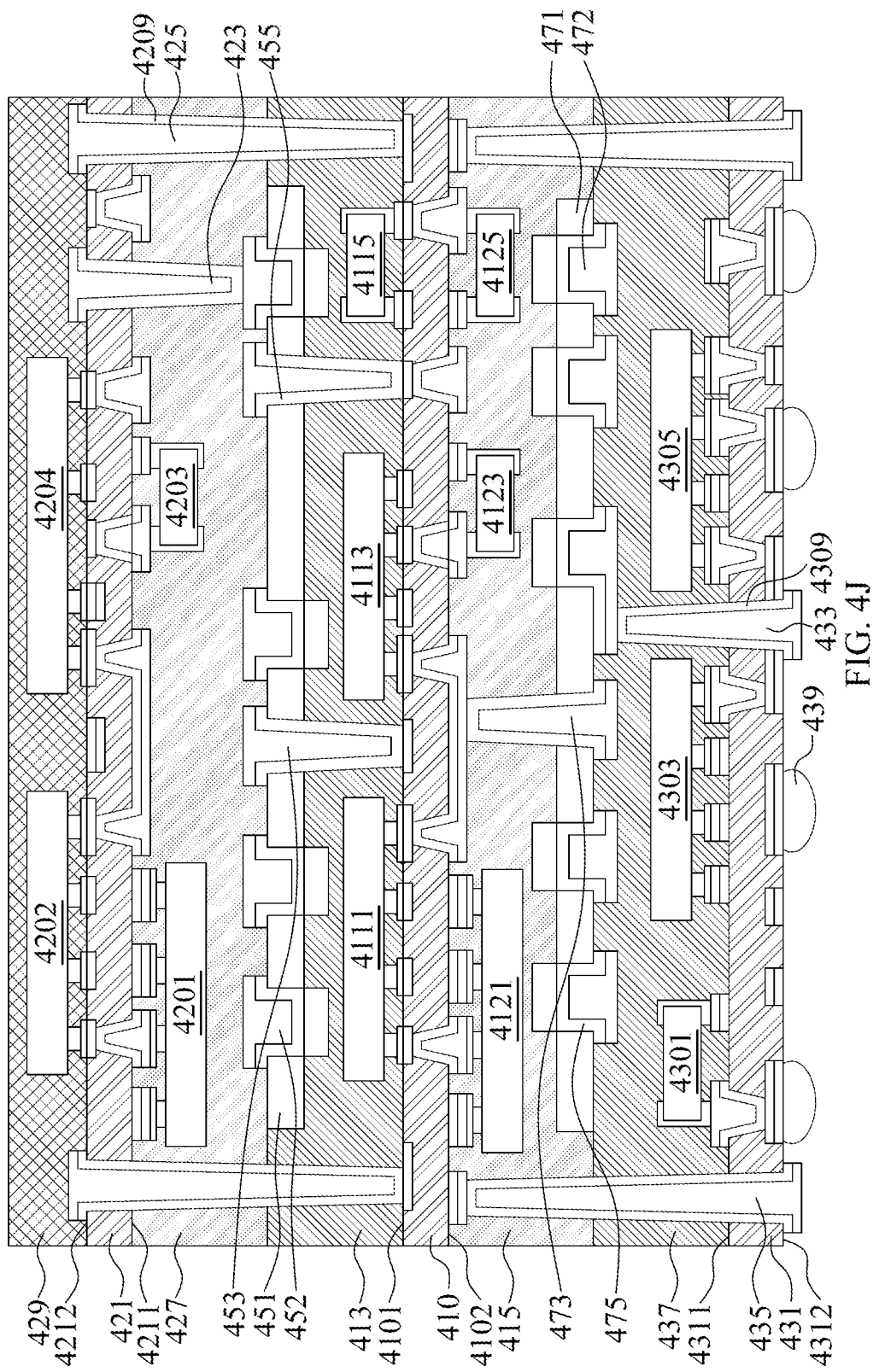
Figure 4K:
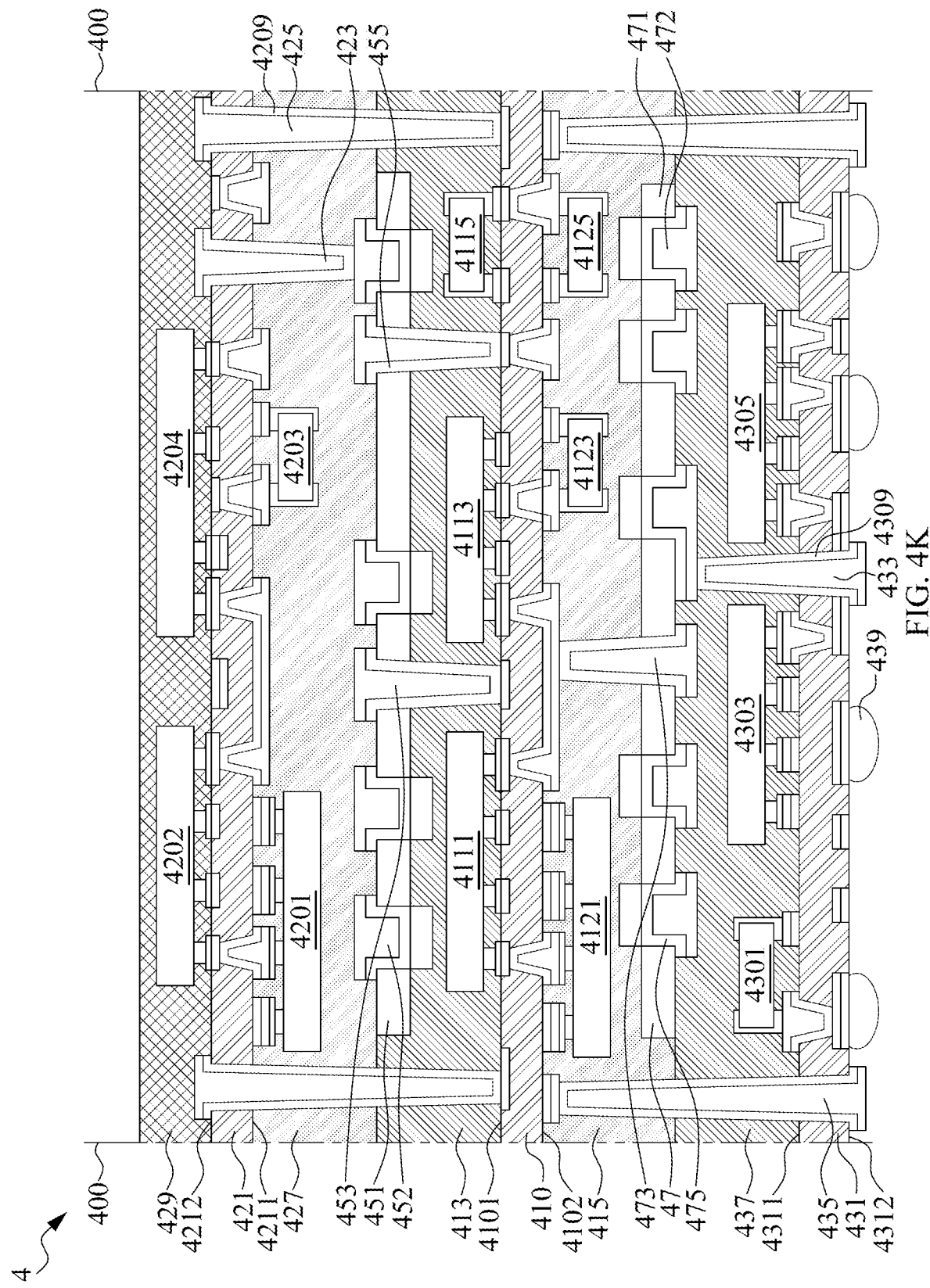
FIG. 4K illustrate a method of manufacturing a semiconductor device package in accordance with another embodiment of the instant disclosure.

FIG. 4A, FIG. 4B, FIG. 4C, FIG. 4D, FIG. 4E, FIG. 4F, FIG. 4G, FIG. 4H, FIG. 4I, FIG. 4J. and FIG. 4K, illustrate a method of manufacturing a semiconductor device package 3 in accordance with another embodiment of the instant disclosure.

Referring to FIG. 4A, a circuit layer 410 with electronic component s 4111, 4113, 4115, 4121, 4123, 4125 is provided. The circuit layer 410 has a surface 4101 and a surface 4102 opposite to the surface 4101. The electronic components 4111, 4113 and 4115 are disposed or mounted on the surface 4101 of the circuit layer 410 and electrically connect to the circuit layer 410. The electronic components 4121, 4123 and 4125 are disposed or mounted on the surface 4102 of the circuit layer 410 and electrically connect to the circuit layer 410.

Referring to FIG. 4B, a dielectric layer 451 is bonded to the surface 4101 of the circuit layer 410 by an adhesion layer 413. The dielectric layer 451 may include an inorganic material, such as silicon. Further, the dielectric layer 471 is bonded to the surface 4102 of the circuit layer 410 by an adhesion layer 415. The dielectric layer 451 may include an inorganic material, such as silicon.

Referring to FIG. 4C, an interconnection layer 452 and the through via 453 are formed in the dielectric layer 451, for example by photolithography and etching processes. The interconnection layer 452 is partially embedded in the dielectric layer 451. The through via 453 extends through the dielectric layer 451 and to the surface 4101 of the circuit layer 410 and electrically connects to the circuit layer 410. Moreover, a seed layer 455 is disposed between the interconnection layer 452 and the dielectric layer 451 and on the sidewall of the through via 453. Further, an interconnection layer 472 and the through via 473 are formed in the dielectric layer 471, for example by photolithography and etching processes. The interconnection layer 472 is partially embedded in the dielectric layer 471. The through via 473 extends through the dielectric layer 471 and to the surface 4102 of the circuit layer 410 and electrically connects to the circuit layer 410. Moreover, a seed layer 475 is disposed between the interconnection layer 472 and the dielectric layer 471 and on the sidewall of the through via 473.

Referring to FIG. 4D, a circuit layer 421 with electronic components 4201 and 4203 is bonded to the dielectric layer 451 by an adhesion layer 427. The electronic components 4201 and 4203 are disposed or mounted on the surface 4211 of the circuit layer 421, which faces the dielectric layer 451, and electrically connect to the circuit layer 421. Further, a circuit layer 431 with electronic components 4301, 4303, 4305 is bonded to the dielectric layer 471 by an adhesion layer 437. The electronic components 4301, 4303, 4305 are disposed or mounted on the surface 4311 of the circuit layer 431, which faces the dielectric layer 471, and electrically connect to the circuit layer 431.

Referring to FIG. 4E, a laser operation may be carried out such that a portion of the circuit layer 421, a portion of the adhesion layer 427 and a portion of the adhesion layer 413 are removed by the laser operation. After the laser operation, a tapered through hole 4270 is formed and a portion of the surface 4101 of the circuit layer 410 is exposed. The laser operation also causes a portion of the circuit layer 421 and a portion of the adhesion layer 427 are removed by the laser operation. After the laser operation, a tapered through hole 4271 is formed and a portion of the interconnection layer 452 is exposed. Moreover, the laser operation also causes a portion of the circuit layer 431, a portion of the adhesion layer 437 and a portion of the adhesion layer 415 are removed by the laser operation. After the laser operation, a tapered through hole 4370 is formed and a portion of the surface 4102 of the circuit layer 410 is exposed. The laser operation also causes a portion of the circuit layer 431 and a portion of the adhesion layer 437 are removed by the laser operation. After the laser operation, a tapered through hole 4371 is formed and a portion of the interconnection layer 472 is exposed.

Referring to FIG. 4F, a seed layer 4209 is formed on the surface 4212 of the circuit layer 421, which faces away from the dielectric layer 451, and inner walls of the through holes 4270 and 4271. Further, a seed layer 4309 is formed on the surface 4312 of the circuit layer 431, which faces away from the dielectric layer 471, and inner walls of the through holes 4370 and 4371.

Referring to FIG. 4G, a conductive via 423 is formed in the through hole 4271, a conductive via 425 is formed in the through hole 4270, a conductive via 433 is formed in the through hole 4371 and a conductive via 435 is formed in the through hole 4370, for example by photolithography and etching processes. The conductive via 425 may extend to the surface 4101 of the circuit layer 410 and thus may electrically connect to the circuit layer 410. The conductive via 423 may extend to the interconnection layer 452 and/or the through via 453 and thus may electrically connect to the interconnection layer 452 and the through via 453. The conductive via 435 may extend to the surface 4102 of the circuit layer 410 and thus may electrically connect to the circuit layer 410. The conductive via 433 may extend to the interconnection layer 472 and/or the through via 473 and thus may electrically connect to the interconnection layer 472 and the through via 473. In addition, the seed layer 4209 on the surface 4212 of the circuit layer 421 and the seed layer 4309 on the surface 4312 of the circuit layer 431 are removed. Therefore, only the seed layer 4209 disposed on the side walls of the conductive vias 423 and 425 and the seed layer 4309 disposed on the side walls of the conductive via 433 and 435 are remained. Moreover, a portion of the interconnection structure of the circuit layer 421 may be exposed on the surface 4212 of the circuit layer 421 by a chemical etching process, and a portion of the interconnection structure of the circuit layer 431 may be exposed on the surface 4312 of the circuit layer 431 by a chemical etching process.

Referring to FIG. 4H, electronic components 4202, and 4204 are disposed or mounted on the surface 4212 of the circuit layer 421 and electrically connect to the circuit layer 421.

Referring to FIG. 4I, an encapsulant 429 is formed on the circuit layer 4212 and encapsulates or cover the surface 4212 of the circuit layer 421 and the electronic components 4202 and 4204.

Referring to FIG. 4J, electrical connections 439 are disposed or mounted on the surface of the 4312 of the circuit layer 431 and electrically connect to the circuit layer 431.

Referring to FIG. 4K, a singulation 400 is performed to form a semiconductor device package 4.

After the manufacturing process as shown in FIG. 4A, FIG. 4B, FIG. 4C, FIG. 4D, FIG. 4E, FIG. 4F, FIG. 4G, FIG. 4H, FIG. 4I, FIG. 4J and FIG. 4K the semiconductor device package 4 is formed (see FIG. 4K). In some embodiments of the present disclosure, the semiconductor device package 4 is the same as, or similar to, the semiconductor device package 2 shown in FIG. 2.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale.

There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
    a first semiconductor module;
    a second semiconductor module stacked on the first semiconductor module;
    a first intermediate circuit layer arranged between the first semiconductor module and the second semiconductor module;
    a first conductive transmission path configured to electrically connect the first semiconductor module with the first intermediate circuit layer; and
    a second conductive transmission path configured to electrically connect the first intermediate circuit layer with the second semiconductor module, wherein the first intermediate circuit layer comprises a dielectric layer and an interconnection layer, and wherein the first conductive transmission path comprises a through via penetrating the dielectric layer of the first intermediate circuit layer.

2. The semiconductor device package of claim 1, wherein no electronic component is mounted on the first intermediate circuit layer.

3. The semiconductor device package of claim 1, wherein the interconnection layer is disposed on a surface of the dielectric layer which faces the second semiconductor module.

4. The semiconductor device package of claim 1, wherein a portion of the interconnection layer is encapsulated by the dielectric layer.

5. A semiconductor device package, comprising:
    a first semiconductor module;
    a second semiconductor module stacked on the first semiconductor module;
    a first intermediate circuit layer arranged between the first semiconductor module and the second semiconductor module;
    a first conductive transmission path configured to electrically connect the first semiconductor module with the first intermediate circuit layer; and
    a second conductive transmission path configured to electrically connect the first intermediate circuit layer with the second semiconductor module, wherein the second semiconductor module comprises a circuit layer with a surface facing the first intermediate circuit layer, and wherein an electronic component is mounted on the surface of the circuit layer of the second semiconductor module, and wherein the second conductive transmission path comprises a conductive via extending through a circuit layer of the second semiconductor module.

6. A semiconductor device package, comprising:
a first semiconductor module;
a second semiconductor module stacked on the first semiconductor module;
a first intermediate circuit layer arranged between the first semiconductor module and the second semiconductor module;
a first conductive transmission path configured to electrically connect the first semiconductor module with the first intermediate circuit layer;
a second conductive transmission path configured to electrically connect the first intermediate circuit layer with the second semiconductor module; and
a third conductive transmission path configured to electrically connect the first semiconductor module with the second semiconductor module.

7. The semiconductor device package of claim 6, wherein the third conductive transmission path comprises a conductive via extending from the second semiconductor module to the first semiconductor module.

8. A semiconductor device package, comprising:
a first semiconductor module;
a second semiconductor module stacked on the first semiconductor module;
a first intermediate circuit layer arranged between the first semiconductor module and the second semiconductor module;
a first conductive transmission path configured to electrically connect the first semiconductor module with the first intermediate circuit layer;
a second conductive transmission path configured to electrically connect the first intermediate circuit layer with the second semiconductor module;
a third semiconductor module stacked on the first semiconductor module;
a second intermediate circuit layer arranged between the first semiconductor module and the third semiconductor module;
a fourth conductive transmission path configured to electrically connect the first semiconductor module with the second intermediate circuit layer; and
a fifth conductive transmission path configured to electrically connect the second intermediate circuit layer with the third semiconductor module.

9. A semiconductor device package, comprising:
a first circuit layer;
a first intermediate circuit layer;
a second circuit layer; wherein the first intermediate circuit layer is arranged between the first circuit layer and the second circuit layer, and wherein an area occupied by the first intermediate circuit layer is smaller than an area occupied by the first circuit layer or an area occupied by the second circuit layer;
a first adhesion layer between the first circuit layer and the first intermediate circuit layer and;
a second adhesion layer between the first intermediate circuit layer and the second circuit layer, wherein the first adhesion layer covers a side surface of the first intermediate circuit layer and a surface of the first intermediate circuit layer, which faces the first circuit layer, and wherein the second adhesion layer covers a surface of the first intermediate circuit layer, which faces the second circuit layer.

10. A semiconductor device package, comprising:
a first circuit layer;
a first intermediate circuit layer;
a second circuit layer; wherein the first intermediate circuit layer is arranged between the first circuit layer and the second circuit layer, and wherein an area occupied by the first intermediate circuit layer is smaller than an area occupied by the first circuit layer or an area occupied by the second circuit layer;
a first conductive transmission path configured to electrically connects the first circuit layer with the first intermediate circuit layer; and
a second conductive transmission path configured to electrically connects the first intermediate circuit layer with the second circuit layer.

11. The semiconductor device package of claim 10, wherein both surfaces of the first intermediate circuit layer are free from an electronic component.

12. The semiconductor device package of claim 10, wherein the first conductive transmission path comprises a through via extending from the first intermediate circuit layer to the first circuit layer, and wherein the second conductive transmission path comprises a conductive via extending from the second circuit layer to the first intermediate circuit layer.

13. A semiconductor device package, comprising:
a first circuit layer
a first intermediate circuit layer;
a second circuit layer; wherein the first intermediate circuit layer is arranged between the first circuit layer and the second circuit layer, and wherein an area occupied by the first intermediate circuit layer is smaller than an area occupied by the first circuit layer or an area occupied by the second circuit layer; and
a third conductive transmission path configured to electrically connect the first circuit layer with the second circuit layer.

14. The semiconductor device package of claim 13, wherein the third conductive transmission path comprises a conductive via extending from the second circuit layer to the first circuit layer, wherein the conductive via does not contact the first intermediate circuit layer.

15. A semiconductor device package, comprising:
a first circuit layer;
a first intermediate circuit layer;
a second circuit layer; wherein the first intermediate circuit layer is arranged between the first circuit layer and the second circuit layer, and wherein an area occupied by the first intermediate circuit layer is smaller than an area occupied by the first circuit layer or an area occupied by the second circuit layer;
a third circuit layer; and
a second intermediate circuit layer arranged between the first circuit layer and the third circuit layer;
wherein an area occupied by the second intermediate circuit layer is smaller than the area occupied by the first circuit layer or an area occupied by the third circuit layer.

16. A method of manufacturing a semiconductor device package, comprising:
providing a first semiconductor module;
disposing a first intermediate circuit layer on the first semiconductor module;
disposing a second semiconductor module on the first intermediate circuit layer;
forming a conductive via, which is configured to electrically connect the second semiconductor module with the first intermediate circuit layer or electrically connect the second semiconductor module with the first semiconductor module;

providing a second intermediate circuit layer underneath the first semiconductor module; and disposing a third semiconductor module underneath the second intermediate circuit layer; and forming a conductive via which is configured to electrically connect the third semiconductor module with the second intermediate circuit layer or electrically connect the third semiconductor module with the first semiconductor module.

17. The method of claim 16, wherein the conductive via extends to the first intermediate circuit layer.

* * * * *